US006281318B1

(12) United States Patent
Yamamoto et al.

(10) Patent No.: US 6,281,318 B1
(45) Date of Patent: Aug. 28, 2001

(54) POLY{1-(1-ALKOXYALKOXY)-4-(1-METHYLETHENYL)BENZENE} HAVING NARROW MOLECULAR WEIGHT DISTRIBUTION, ITS PREPARATION PROCESS, AND PREPARATION PROCESS OF POLY{4-METHYLETHENYL)PHENOL} HAVING NARROW MOLECULAR WEIGHT DISTRIBUTION

(75) Inventors: Yoshihiro Yamamoto; Toshiro Takao; Ritsuko Fukuda; Isao Hara, all of Kanagawa (JP)

(73) Assignee: Mitsui Chemicals, Inc. (JP)

( * ) Notice: Subject to any disclaimer, the term of this patent is extended or adjusted under 35 U.S.C. 154(b) by 0 days.

(21) Appl. No.: 09/031,646

(22) Filed: Feb. 27, 1998

(30) Foreign Application Priority Data

| Mar. 4, 1997 | (JP) | 9-049030 |
| Mar. 19, 1997 | (JP) | 9-066586 |
| Apr. 22, 1997 | (JP) | 9-104720 |
| May 13, 1997 | (JP) | 9-122141 |

(51) Int. Cl.[7] ............................. C08F 12/24; C08F 12/32; C08F 212/14; C08F 212/32
(52) U.S. Cl. ..................... 526/313; 526/173; 525/328.8
(58) Field of Search ..................... 526/313, 173

(56) References Cited

U.S. PATENT DOCUMENTS

| 4,054,611 | 10/1977 | Mimaki et al. . |
| 4,822,862 | 4/1989 | Rupp et al. . |
| 5,468,589 | 11/1995 | Urano et al. . |
| 5,670,299 | 9/1997 | Urano et al. . |

FOREIGN PATENT DOCUMENTS

| 0718 316 A2 | * 6/1995 | (EP) . |
| 0675410 | 10/1995 | (EP) . |
| 56-52886 | 12/1981 | (JP) . |
| 57-44609 | 3/1982 | (JP) . |
| 59-199705 | 11/1984 | (JP) . |
| 61-179204 | 8/1986 | (JP) . |
| 63-199705 | 8/1988 | (JP) . |
| 5-1115 | 1/1993 | (JP) . |
| 5-249682 | 9/1993 | (JP) . |
| 6-32819 | 2/1994 | (JP) . |
| 6-32832 | 2/1994 | (JP) . |
| 0588544 | 3/1994 | (JP) . |
| 6-194842 | 7/1994 | (JP) . |
| 7-319155 | 12/1995 | (JP) . |

OTHER PUBLICATIONS

Hiroshi Ito et al, "Sensitive Resist Systems Based on Acid–Catalyzed Polymer Reactions", *Makromol. Chem., Macromol. Symp.*, 53, pp. 139–149 (1992).

Simon Hesp et al, "Tetrahydropyranyl– and Furanyl–Protected Polyhydroxstyrene in Chemical Amplification Systems", *Journal of Applied Polymer Science*, vol. 42, pp. 877–883 (1991).

N. Hayashi et al, "Tetrahydropyranyl and Tetrahydrofuranyl Protected Polyhydroxystyrenes in Chemical Amplification Resist Systems for KrF Excimer Laser Lithography", *Polym. Mater. Sci. Eng.*, 61, pp. 417–421 (1989).

* cited by examiner

*Primary Examiner*—Donald R. Wilson
(74) *Attorney, Agent, or Firm*—Burns, Doane, Swecker & Mathis, L.L.P.

(57) ABSTRACT

There are herein disclosed a poly{1-(1-alkoxyalkoxy)-4-(1-methylethenyl)benzene} having a narrow molecular weight distribution, for example, a poly{1-(1-alkoxyethoxy)-4-(1-methylethenyl)benzene} or a poly{1-(2-tetrahydrofuranyloxy)-4-(1-methylethenyl)benzene} which is useful as a chemical amplification type positive resist material; a preparation process of the polymer which comprises reacting industrially easily available 4-(1-methylethenyl)phenol with a vinyl ether to produce an alkoxyalkoxy compound, and then carrying out an anionic polymerization; and a preparation process of poly{4-(1-methylethenyl)phenol} having a narrow molecular weight distribution useful as a tease polymer for a chemical amplification type positive resist material which comprises reacting the above-mentioned polymer with a protonic acid in the presence of an organic solvent.

20 Claims, 11 Drawing Sheets

POLY{1-(1-ALKOXYALKOXY)-4-(1-METHYLETHENYL)BENZENE} HAVING NARROW MOLECULAR WEIGHT DISTRIBUTION, ITS PREPARATION PROCESS, AND PREPARATION PROCESS OF POLY{4-METHYLETHENYL)PHENOL} HAVING NARROW MOLECULAR WEIGHT DISTRIBUTION

BACKGROUND OF THE INVENTION (1) Field of the Invention

The present invention relates to a poly{1-(1-alkoxyalkoxy)-4-(1-methylethenyl)benzene} having a narrow molecular weight distribution, its preparation process, and a preparation process of poly(p-hydroxy-α-methylstyrene) having a narrow molecular weight distribution [hereinafter referred to as "poly{4-(1-methylethenyl)phenol}"].

More specifically, the present invention relates to a poly{1-(1-alkoxyalkoxy)-4-(1-methylethenyl)benzene} having a narrow molecular weight distribution, for example, a poly{1-(1-alkoxyethoxy)-4-(1-methylethenyl)benzene} or a poly{1-(2-tetrahydrofuranyloxy)-4-(1-methylethenyl) benzene} which is useful as a chemical amplification type positive resist material, and a preparation process of the polymer from industrially easily available 4-(1-methylethenyl)phenol as a starting material.

In addition, the present invention relates to a preparation process, from the above-mentioned polymer as a starting material, of poly{4-(1-methylethenyl)phenol} having a narrow molecular weight distribution which is useful, for example, as a base polymer for a chemical amplification type positive resist material.

(2) Description of the Prior Art

Poly(p-hydroxystyrene) has been noticed as a base polymer for a lithography of a high resolution or for a resist material for use in LSIs, and many preparation processes regarding the polymer have been suggested (e.g., Japanese Patent Application Laid-open Nos. 44609/1982, 199705/1988, 32832/1994 and 1115/1993).

On the other hand, poly{4-(1-methylethenyl)phenol} is more useful as compared with poly(p-hydroxystyrene), because poly{4-(1-methylethenyl)phenol} is more improved by the effect of a methyl group on the α-position than poly(p-hydroxystyrene) in performances such as a dissolution rate in a resist removal step with a release agent and a plasma resistance in a dry etching step which are required as the resist material applicable to a high integration. However, a polymerization method of poly{4-(1-methylethenyl)phenol} is limited by electronic and steric influences of the methyl group on the α-position, and hence a preparation method of poly(p-hydroxystyrene) cannot directly be applied as it is.

In fact, the present inventors applied some of typical methods disclosed as the preparation method of poly(p-hydroxystyrene) to the preparation of poly{4-(1-methylethenyl)phenol}.

For example, in accordance with a method described in Japanese Patent Application Laid-open No. 32832/1994, an anionic polymerization of p-t-butoxycarbonyloxy-α-methylstyrene was tried at −78° C. in the presence of n-butyl lithium as a polymerization initiator in tetrahydrofuran, but a reaction between a t-butoxycarbonyloxy group and n-butyl lithium predominantly occurred, so that the desired polymer could scarcely be obtained.

Furthermore, in accordance with a method described in Japanese Patent Application Laid-open No. 1115/1993, an anionic polymerization of p-tetrahydropyranyloxy-α-methylstyrene was tried at −78° C. for 1 hour in the presence of n-butyl lithium as a polymerization initiator in tetrahydrofuran, but a polymerization reaction scarcely proceeded, so that the desired polymer could not be obtained.

However, there have been suggested some methods by which these difficulties can be solved and poly{4-(1-methylethenyl)phenol} can be manufactured.

Japanese Patent Application Laid-open No. 179204/1986 has disclosed a method which comprises subjecting an esterified compound of p-hydroxy-α-methylstyrene to a cationic polymerization in the presence of antimony pentahalide as a catalyst to form a polymer, and then hydrolyzing the polymer to obtain poly{4-(1-methylethenyl)phenol}. In this cationic polymerization, however, methanol or water is used as a polymerization terminator, and therefore, a terminal of thus obtained poly{4-(1-methylethenyl)phenol} should be a methoxy group or a hydroxy group. As just described, the functional group naturally bonds to the polymer terminal, so that resistance to thermal decomposition deteriorates. For this reason, the thus obtained poly{4-(1-methylethenyl)phenol} is not preferable as a base polymer for a resist material which is required to be heated in a lithography step.

In Makromol. Chem., Macromol. Symp., Vol. 53, p. 139–149 (1992), there has been disclosed a method which comprises subjecting p-tert-butoxycarbonyloxy-α-methylstyrene to a cationic polymerization in the presence of a boron trifluoride ether adduct as a catalyst in a sulfur dioxide solvent to form poly(p-tert-butoxycarbonyloxy-α-methylstyrene), and then heating this compound at about 200° C. to obtain poly{4-(1-methylethenyl)phenol}.

However, since similarly utilizing the cationic polymerization, this method also has the same drawback as described above. In addition, the molecular weight distribution of the polymer obtained by this method is relatively broad, that is, 2.4 to 4.6, and it is not preferable as a resist material in this point.

Japanese Patent Application Laid-open No. 199705/1984 has disclosed a method which comprises reacting p-bromo-α-methylstyrene with magnesium in an ether, further reacting it with peroxybenzoic acid 1,1-dimethylpropyl ester in tetrahydrofuran to obtain p-1,1-dimethylpropoxy-α-methylstyrene, subjecting this compound to an anionic polymerization, and then carrying out an acid decomposition to obtain poly{4-(1-methylethenyl)phenol}. However, this method employs a Grignard reaction, and an equimolar or more magnesium is necessary, and the handling of secondarily produced magnesium bromide is troublesome. Accordingly, the disclosed method is not considered to be a practical method.

In Japanese Patent Application Laid-open No. 32819/1994, there has been disclosed a method which comprises subjecting methoxymethoxy-α-methylstyrene to a living anionic polymerization, and then eliminating a methoxymethoxy group to obtain poly{4-(1-methylethenyl)phenol}. However, in this method, in order to synthesize methoxymethoxy-α-methylstyrene which is a starting material, an expensive chloromethyl methyl ether is necessary. In addition, an equimolar alkali metal chloride is formed as a by-product, and hence the treatment of this by-product is also required. Accordingly, this method is not considered to be an industrial manufacturing method.

As described above, an efficient preparation method of poly{4-(1-methylethenyl)phenol} has not been present so far, and hence it has riot been industrially used.

On the other hand, a poly{1-(1-alkoxyalkoxy)-4-(1-methylethenyl)benzene} is considered to be useful as a chemical amplification type positive resist material having a high sensitivity, a high resolution and a high plasma resistance in a dry etching step.

As conventional techniques, typical preparation methods of only a related poly{1-(1-alkoxyethoxy)-4-ethenylbenzene} have been present as follows.

(1) A method which comprises reacting p-bromophenol with an alkyl vinyl ether to obtain a p-bromo(1-alkoxyethoxy)benzene, reacting this compound with metallic magnesium, carrying out a Grignard reaction between the reaction product and vinyl bromide in the presence of dichloro{1,2-bis(diphenylphosphino)ethane}nickel as a catalyst to obtain a p-(1-alkoxyethoxy)styrene, and then adding 2,2'-azobisisobutyronitrile as an initiator to the reaction system to carry out a radical polymerization, thereby preparing the desired product (Japanese Patent Application Laid-open Nos. 194842/1994 and 249682/1993).

(2) A method which comprises adding 2,2'-azobisisobutyronitrile as an initiator to p-tert-butoxystyrene to carry out a radical polymerization and to thereby obtain poly(p-tert-butoxystyrene), eliminating a tert-butoxy group by concentrated hydrochloric acid to obtain poly(p-hydroxystyrene), and then reacting this compound with an alkyl vinyl ether to prepare the desired product (Japanese Patent Application Laid-open No. 319155/1995).

However, these methods cannot provide any polymer having a narrow molecular weight distribution, and therefore, the products obtained by these conventional methods are poor as chemical amplification type positive resist materials in which a high resolution is required.

Of these methods, the method (1) comprises first changing a phenolic hydroxyl group of p-bromophenol as the starting material into an alkoxyethoxy group, carrying out the Grignard reaction, and then conducting the radical polymerization. Therefore, this method has many reaction steps, and in the Grignard reaction, the expensive catalyst having a phosphine ligand is used. Thus, the recovery and reuse of this catalyst is indispensable, which makes the process more complex. In addition, the secondary production of a large amount of magnesium bromide causes one problem, and hence, the method (1) cannot be considered to be an industrial preparation method of the poly{1-(1-alkoxyethoxy)-4-ethenylbenzene}.

Moreover, in the method (2), poly(p-hydroxystyrene) is first obtained, and the alkoxyethoxy compound is then formed. However, owing to the reaction with the polymer, it is difficult to sufficiently carry out the reaction with the alkyl vinyl ether, and the obtain product is a copolymer of a p-(1-alkoxyethoxy)styrene and p-hydroxystyrene. In consequence, a homopolymer of a 1-(1-alkoxyethoxy)-4-ethenylbenzene cannot be obtained.

Furthermore, it is known that the related poly{1-(2-tetrahydrofuranyloxy)-4-ethenylbenzene} is useful as a chemical amplification type positive resist material having a high sensitivity, a high resolution and a high plasma resistance in a dry etching step, and also useful as a starting material for the preparation of p-hydroxystyrene polymer by eliminating a part or all of 2-tetrahydrofuranyloxy groups from the polymer [Journal of Applied Polymer Science, Vol. 42, p. 877–883 (1991) and Polym. Mater. Sci. Eng., Vol. 61, p. 417–421 (1989)].

It is also known that the tetrahydrofuranyloxy group has higher acid decomposition properties as compared with the tetrahydropyranyloxy group, and hence the compound having the tetrahydrofuranyloxy group is useful as the resist material.

As a preparation process of this poly{1-(2-tetrahydrofuranyloxy)-4-ethenylbenzene}, there has been disclosed a method which comprises reacting p-hydroxybenzaldehyde with 2,3-dihydrofuran in the presence of an acid to obtain p-dihydrofuranyloxybenzaldehyde, carrying out a Wittig reaction between this compound and (bromomethyl)triphenylsulfonium bromide in the presence of tert-butoxy potassium to obtain 1-(2-tetrahydrofuranyloxy)-4-ethenylbenzene, and then subjecting this compound to a radical polymerization in the presence of azoisobutyronitrile as a polymerization initiator to prepare the desired product.

However, this method cannot provide the polymer having a narrow molecular weight distribution, and therefore, the product obtained by this method is poor as a chemical amplification type positive resist material in which a high resolution is required. Moreover, in a lithography step, there is a drawback that a dissolution rate in a resist removal with a release agent is too high.

In this preparation method, p-hydroxybenzaldehyde is used as a starting material, and a phenolic hydroxyl group is first changed into a tetrahydrofuranyloxy group, followed by the Wittig reaction and the radical polymerization. However, this method has many reaction steps and so it is complex, and during the Wittig reaction, an expensive phosphonium salt is changed into phosphine oxide, so that many by-products are formed and their handling is difficult. In consequence, this method is not practical as the preparation method of poly{1-(2-tetrahydrofuranyloxy)-4-ethenylbenzene}.

On the other hand, 4-(1-methylethenyl)phenol (popular name: p-hydroxy-α-methylstyrene) can be easily obtained by the thermal decomposition of 2,2-bis(4'-oxyphenyl)propane (popular name: bisphenol A) (Japanese Patent Publication 52886/1981).

Thus, the present inventors have presumed that if a poly{1-(1-alkoxyalkoxy)-4-(1-methylethenyl)benzene} having a narrow molecular weight distribution, for example, a poly{1-(1-alkoxyethoxy)-4-(1-methylethenyl)benzene} or a poly{1-(2-tetrahydrofuranyloxy)-4-(1-methylethenyl) benzene} can be easily prepared from an industrially easily available 4-(1-methylethenyl)phenol as a starting material, the thus prepared polymer can be utilized as a polymer which is useful as a chemical amplification type positive resist material, and from this polymer, poly{4-(1-methylethenyl)phenol} having a narrow molecular weight distribution which is useful as a base polymer for the resist material can be prepared. Accordingly, the present inventors have intensively investigated with the intention of realizing these presumptions.

As a result, it has been found that (1) a poly{1-(1-alkoxyethoxy)-4-(1-methylethenyl)benzene} having an optional molecular weight and a narrow molecular weight distribution can be easily prepared in a high yield by reacting 4-(1-methylethenyl)phenol with an alkyl vinyl ether to form an alkoxyethoxy compound, and then subjecting this compound to an anionic polymerization; (2) a poly{1-(2-tetrahydrofuranyloxy)-4-(1-methylethenyl)benzene} having an optional molecular weight and a narrow molecular weight distribution can be easily prepared in a high yield by reacting 4-(1-methylethenyl)phenol with a dihydrofuran to form a tetrahydrofuranyloxy compound, and then subjecting this compound to an anionic polymerization; and (3) poly{4-(1-methylethenyl)phenol} having an optional molecular weight and a narrow molecular weight distribution can be easily prepared in a high yield by reacting the above-mentioned polymer with a protonic acid in the presence of an organic solvent. In consequence, the present invention has been attained.

SUMMARY OF THE INVENTION

An object of the present invention is to provide a poly{1-(1-alkoxyalkoxy)-4-(1-methylethenyl)benzene} having a weight-average molecular weight of 2,000 to 100,000 and a weight-average molecular weight/number-average molecular weight ratio of 1.6 or less, poly{4-(1-methylethenyl)phenol} having a weight-average molecular weight of 1,000 to 80,000 and a weight-average molecular weight/number-average molecular weight ratio of 1.6 or less, and a preparation process of each of these polymers.

BRIEF DESCRIPTION OF THE DRAWINGS

Further objects and advantages of the present invention can be more fully understood from the following detailed description taken in conjunction with the accompanying drawings in which.

DESCRIPTION OF THE PREFERRED EMBODIMENT

Figure 1:
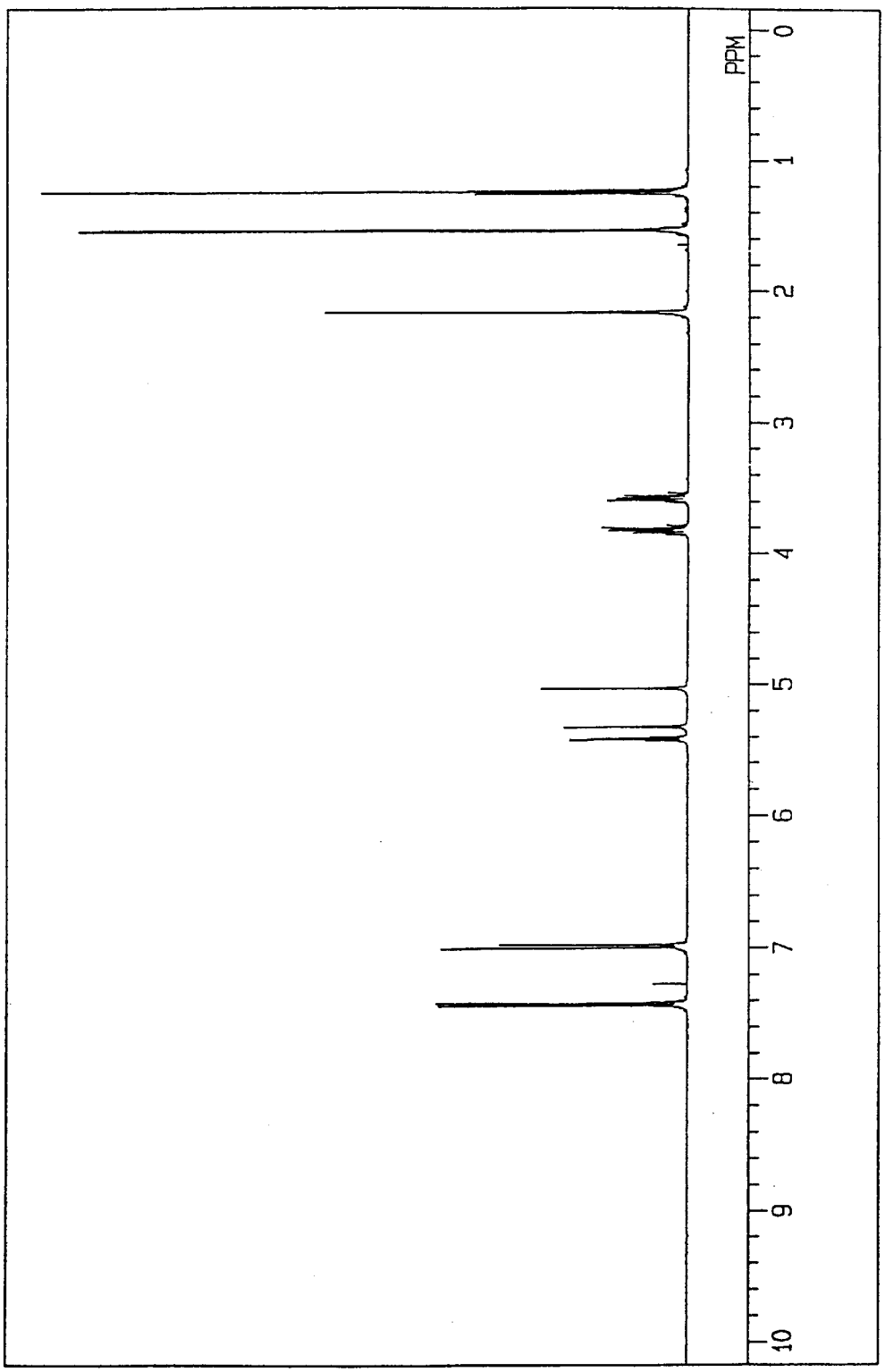
FIG. 1 is a $^1$H-NMR spectrum, in CDCl$_3$, of 1-(1-ethoxyethoxy)-4-(1-methylethenyl)benzene synthesized in Example 1.

That is to say, the aspects of the present invention covers the following inventions and embodiments.

(a) A poly{1-(1-alkoxyalkoxy)-4-(1-methylethenyl) benzene} having a narrow molecular weight distribution, a weight-average molecular weight of 2,000 to 100,000, a weight-average molecular weight/number-average molecular weight ratio (Mw/Mn) of 1.6 or less, and a repeating unit represented by the chemical formula (1)

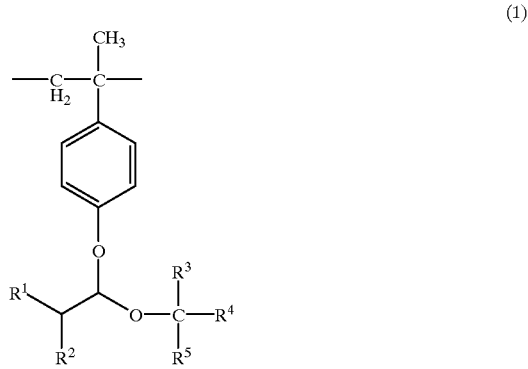

(1)

wherein R$^1$ is hydrogen or an alkyl group having 1 to 3 carbon atoms; R$^2$ is hydrogen, an alkyl group having 1 to 6 carbon atoms or an alkoxy group having 1 to 6 carbon atoms; R$^3$, R$^4$ and R$^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms, or an alkoxyalkoxy group having 1 to 10 carbon atoms; and R$^2$ and R$^3$ may bond to each other to form a ring structure.

(b) The poly{1-(1-alkoxyalkoxy)-4-(1-methylethenyl) benzene} having a narrow molecular weight distribution according to the paragraph (a) wherein the repeating unit is represented by the chemical formula (2)

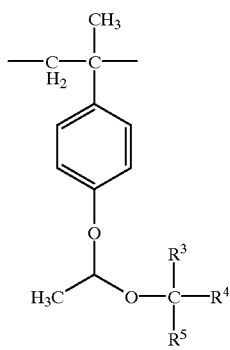
(2)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

(c) The poly{1-(1-alkoxyalkoxy)-4-(1-methylethenyl) benzene} having a narrow molecular weight distribution according to the paragraph (a) wherein the repeating unit is represented by the chemical formula (3):

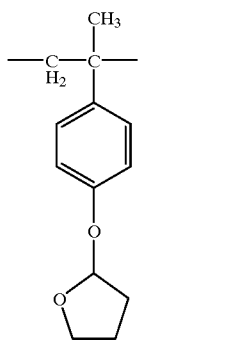
(3)

(d) A preparation process of a poly{1-(1-alkoxyalkoxy)-4-(1-methylethenyl)benzene} having a narrow molecular weight distribution described in the paragraph (a) which comprises the steps of reacting 4-(1-methylethenyl)phenol with a vinyl ether represented by the chemical formula (4)

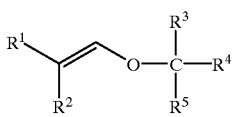
(4)

wherein $R^1$ is hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure, in the presence of an acid to prepare a 1-(1-alkoxyalkoxy)-4-(1-methylethenyl)benzene represented by the chemical formula (5)

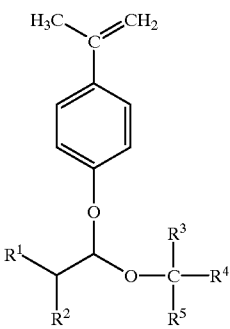
(5)

wherein $R^1$ is hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted, an alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure, and then subjecting this compound to an anionic polymerization in the presence of an organic alkali metal compound as a polymerization initiator.

(e) The method according to the paragraph (d) wherein the vinyl ether represented by the chemical formula (4) is a compound represented by the chemical formula (6)

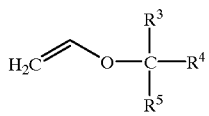
(6)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms, and the 1-(1-alkoxyalkoxy)-4-(1-methylethenyl) benzene represented by the chemical formula (5) is a compound represented by the chemical formula (7)

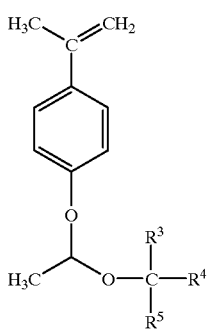
(7)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

(f) The method according to the paragraph (d) wherein the vinyl ether represented by the chemical formula (4) is a dihydrofuran, and the 1-(1-alkoxyalkoxy)-4-(1-methylethenyl)benzene represented by the chemical formula (5) is a compound represented by the formula (8):

(8)

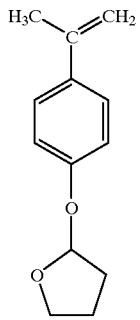

(g) A preparation process of poly{4-(1-methylethenyl)phenol} having a narrow molecular weight distribution which comprises the steps of reacting 4-(1-methylethenyl)phenol with a vinyl ether represented by the chemical formula (4) in the presence of an acid to form a 1-(1-alkoxyalkoxy)-4-(1-methylethenyl)benzene represented by the chemical formula (5), subjecting this compound to an anionic polymerization in the presence of an organic alkali metal compound as a polymerization initiator to form a poly{1-(1-alkoxyalkoxy)-4-(1-methylethenyl)benzene} having the narrow molecular weight distribution described in the paragraph (a), and then bringing this compound into contact with a protonic acid in the presence of an organic solvent to carry out an alkoxyalkoxy group eliminating reaction.

(h) The process according to the paragraph (g) wherein the vinyl ether represented by the chemical formula (4) is a compound represented by the chemical formula (6), and the 1-(1-alkoxyalkoxy)-4-(1-methylethenyl)benzene represented by the chemical formula (5) is a compound represented by the chemical formula (7).

(i) The process according to the paragraph (g) wherein the vinyl ether represented by the chemical formula (4) is a dihydrofuran, and the 1-(1-alkoxyalkoxy)-4-(1-methylethenyl)benzene represented by the chemical formula (5) is a compound represented by the chemical formula (8).

(j) The process according to the paragraph (d) wherein the organic alkali metal compound is a compound represented by the chemical formula (9)

(9)

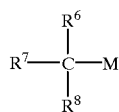

wherein $R^6$ and $R^7$ are each independently an alkyl group having 1 to 10 carbon atoms, an un-substituted or alkyl-substituted aryl group having 6 to 12 carbon atoms; $R^8$ is hydrogen or an alkyl group having 1 to 10 carbon atoms; and M is an alkali metal selected from the group consisting of lithium, sodium, potassium and cesium, a compound represented by the chemical formula (10)

(10)

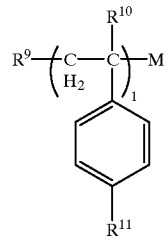

wherein $R^9$ is hydrogen or an alkyl group having 1 to 10 carbon atoms; $R^{10}$ is an alkyl group having 1 to 3 carbon atoms, or an un-substituted or alkyl-substituted aryl group having 6 to 12 carbon atoms; $R^{11}$ is hydrogen or an alkyl group, an alkoxy group or an alkoxyalkoxy group having 1 to 10 carbon atoms; M is an alkali metal selected from the group consisting of lithium, sodium, potassium and cesium; and l is an integer of 1 to 200, a compound represented by the chemical formula (11)

(11)

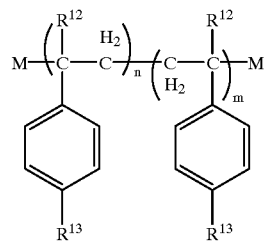

wherein $R^{12}$ is an alkyl group having 1 to 3 carbon atoms; $R^{13}$ is hydrogen or an alkyl group, an alkoxy group or an alkoxyalkoxy group having 1 to 10 carbon atoms; M is an alkali metal selected from the group consisting of lithium, sodium, potassium and cesium; m and n are each an integer of 1 to 100, or a compound represented by the chemical formula (12)

M—Ar (12)

wherein Ar is an organic group selected from the group consisting of naphthalene, anthracene, indene, cyclopentadiene and fluorene; and M is an alkali metal selected from the group consisting of lithium, sodium, potassium and cesium.

(k) The process according to the paragraph (g) wherein the organic alkali metal compound is a compound represented by the chemical formula (9), the chemical formula (10), the chemical formula (11) or the chemical formula (12).

(l) The process according to the paragraph (d) wherein the organic alkali metal compound is selected from the group consisting of sec-butyl lithium, α-methylstyrene dimer dipotassium, α-methylstyrene tetramer disodium, cumyl potassium, cumyl cesium, sodium naphthalene and anthracene sodium.

(m) The process according to the paragraph (g) wherein the organic alkali metal compound is selected from the group consisting of sec-butyl lithium, α-methylstyrene dimer dipotassium, α-methylstyrene tetramer disodium, cumyl potassium, cumyl cesium, sodium naphthalene and anthracene sodium.

(n) The process according to the paragraph (e) wherein the compound represented by the chemical formula (6) is selected from the group consisting of methyl vinyl ether, ethyl vinyl ether, n-propyl vinyl ether, iso-propyl vinyl ether, n-butyl vinyl ether, sec-butyl vinyl ether, tert-butyl vinyl ether and tert-amyl vinyl ether.

(o) The process according to the paragraph (h) wherein the compound represented by the chemical formula (6) is selected from the group consisting of methyl vinyl ether, ethyl vinyl ether, n-propyl vinyl ether, iso-propyl vinyl ether, n-butyl vinyl ether, sec-butyl vinyl ether, tert-butyl vinyl ether and tert-amyl vinyl ether.

(p) The process according to the paragraph (f) wherein the dihydrofuran is 2,3-dihydrofuran.

(q) The process according to the paragraph (i) wherein the dihydrofuran is 2,3-dihydrofuran.

(r) A resist material which comprises a polymer having a weight-average molecular weight of 2,000 to 100,000, a weight-average molecular weight/number-average molecular weight ratio of 1.6 or less and a repeating unit represented by the chemical formula (1).

(s) A resist material which comprises a polymer described in the paragraph (r) wherein the repeating unit is represented by the chemical formula (2).

(t) A resist material which comprises a polymer described in the paragraph (r) wherein the repeating unit is represented by the chemical formula (3).

A poly{1-(1-alkoxyalkoxy)-4-(1-methylethenyl) benzene} having a narrow molecular weight distribution according to the present invention is a polymer having a repeating unit represented by the chemical formula (1), preferably a poly{1-(1-alkoxyethoxy)-4-(1-methylethenyl) benzene} having a repeating unit represented by the chemical formula (2) or a poly{1-(2-tetrahydrofuranyloxy)-4-(1-methylethenyl)benzene} having a repeating unit represented by the chemical formula (3).

In these polymers, a weight-average molecular weight is in the range of 2,000 to 100,000, preferably 5,000 to 80,000, more preferably 6,000 to 50,000, and a weight-average molecular weight/number-average molecular weight ratio (Mw/Mn) is 1.6 or less, preferably in the range of 1.0 to 1.2.

In this connection, the weight-average molecular weight, the number-average molecular weight and the weight-average molecular weight/number-average molecular weight ratio (Mw/Mn) of the polymer which can he used in the present invention can be obtained at 35° C. in tetrahydrofuran as a solvent on the basis of polystyrene by the use of a gel permeation chromatography (GPC).

In the present invention, 4-(1-methylethenyl)phenol is first reacted with a vinyl ether represented by the chemical formula (4) in the presence of an acid to prepare a 1-(1-alkoxyalkoxy)-4-(1-methylethenyl)benzene represented by the chemical formula (5).

Preferably, 4-(1-methylethenyl)phenol is reacted with an alkyl vinyl ether in the presence of an acid to prepare a 1-(1-alkoxyethoxy)-4-(1-methylethenyl)benzene.

And preferably, 4-(1-methylethenyl)phenol is reacted with a dihydrofuran in the presence of an acid to prepare 1-(2-tetrahydrofuranyloxy)-4-(1-methylethenyl)benzene.

4-(1-methylethenyl)phenol can easily be obtained by the thermal decomposition of 2,2-bis(4'-oxyphenyl)propane (Japanese Patent Publication No. 52886/1981).

The vinyl ether in the present invention is a vinyl ether represented by the chemical formula (4), preferably, an alkyl vinyl ether represented by the chemical formula (6) or a dihydrofuran.

Examples of such an alkyl vinyl ether include methyl vinyl ether, ethyl vinyl ether, n-propyl vinyl ether, iso-propyl vinyl ether, n-butyl vinyl ether, sec-butyl vinyl ether, tert-butyl vinyl ether, iso-octyl vinyl ether, decyl vinyl ether, dodecyl vinyl ether, cyclohexyl vinyl ether, 2-ethylhexyl vinyl ether, tert-pentyl vinyl ether, octadecyl vinyl ether, cetyl vinyl ether, 2-methoxyethyl vinyl ether, vinyl-2-(2-ethoxyethoxy)ethyl ether, ethylene glycol butyl vinyl ether and tert-amyl vinyl ether, and each of these alkyl vinyl ethers may be substituted by an alkoxy group.

Above all, methyl vinyl ether, ethyl vinyl ether, n-propyl vinyl ether, iso-propyl vinyl ether, n-butyl vinyl ether, sec-butyl vinyl ether, tert-butyl vinyl ether and tert-amyl vinyl ether are preferable, and ethyl vinyl ether, n-propyl vinyl ether, iso-propyl vinyl ether, n-butyl vinyl ether, sec-butyl vinyl ether and tert-butyl vinyl ether are more preferable.

Furthermore, the dihydrofuran is 2,3-dihydrofuran or 2,5-dihydrofuran, and it may have an alkyl group or an alkoxy group on a furan ring, so long as it does not impair the reaction. Above all, 2,3-dihydrofuran is preferable.

The amount of the vinyl ether to be used is usually 10 mol or less, preferably in the range of 0.1 to 5 mol, more preferably in the range of 0.5 to 3 mol per mol of 4-(1-methylethenyl)phenol.

4-(1-methylethenyl)phenol and the vinyl ether which can be used as the starting materials contain an alkali compound such as potassium hydroxide as a stabilizer, a polymerization inhibitor and the like on occasion, but they may be used without any problems, even if these additives are not removed by a purifying operation such as distillation. However, for example, when potassium hydroxide is contained, the amount of the acid which can be used as the catalyst increases. Therefore, it is preferable that potassium hydroxide which is the stabilizer is removed by the purifying operation, or the starting materials which do not contain the stabilizer are used.

Examples of the acid include hydrogen halides such as a hydrogen chloride gas, mineral acids such as sulfuric acid, phosphoric acid, hydrochloric acid and hydrobromic acid, solid acids such as heteropoly-acid and Nafion, and organic acids such as p-toluenesulfonic acid, trifluoroacetic acid, acetic acid, propionic acid, malonic acid, oxalic acid, chlorosulfonic acid pyridine salt, sulfuric acid pyridine salt and p-toluenesulfonic acid pyridine salt. Above all, the hydrogen chloride gas, hydrochloric acid, trifluoroacetic acid, p-toluenesulfonic acid pyridine salt and sulfuric acid pyridine salt are preferable. These acids can be used singly, or two or more of them can be used simultaneously or successively.

The amount of the acid to be used is 2 mol or less, preferably in the range of 0.00001 to 0.2 mol, more preferably in the range of 0.0001 to 0.05 mol per mol of 4-(1-methylethenyl)phenol.

The reaction of the method according to the present invention can be carried out without using any solvent on occasion, but in general, it is done in the presence of the solvent. As the solvent in the case that it is used, any solvent can be used, so long as it does not impair the reaction. Typical examples of the solvent include water; aliphatic and alicyclic hydrocarbons such as n-hexane, n-pentane, n-heptane and cyclohexane; aromatic hydrocarbons such as benzene, toluene, ethylbenzene and cumene; aliphatic and aromatic halogen compounds such as dichloromethane, chloroform, chlorobenzene and dichlorobenzene; ethers such as diethyl ether, diphenyl ether, tetrahydrofuran, 1,4-dioxane, ethylene glycol dimethyl ether and ethylene glycol diethyl ether; ketones such as acetone, ethyl methyl ketone and acetophenone; nitrites such as acetonitrile and propionitrile; and esters such as ethyl acetate and ethyl propionate. They may be used singly or in the form of a mixture of two or more thereof. In addition, the phase of a reaction solution is preferably made uniform by the use of the solvent, but the use of plural nonuniform phases is also acceptable.

No particular restriction is put on a practical system of the reaction in the process of the present invention, and any system can be used, so long as it can effectively mix and contact 4-(1-methylethenyl)phenol, the vinyl ether, the acid and the solvent which may be used. Any of a batch system, a semi-hatch system and a continuous stream system is usable.

The temperature and the time of the present invention depend on the kinds and the amounts of the vinyl ether which is the starting material, the acid and the solvent which may be used. However, the reaction temperature is usually in the range of −10° C. to 100° C., preferably 0 to 60° C. The reaction time is usually within 20 hours, and preferably 0.01 to 10 hours. The reaction can be carried out under any of reduced pressure, atmospheric pressure and increased pressure.

The reaction in the process of the present invention can be carried out under an inert gas atmosphere or in the presence of molecular oxygen such as air.

By the reaction in the process of the present invention, there can be obtained a 1-(1-alkoxyalkoxy)-4-(1-methylethenyl)benzene represented by the chemical formula (5), preferably 1-(1-alkoxyethoxy)-4-(1-methylethenyl) benzene represented by the chemical formula (7) or 1-(2-tetrahydrofuranyloxy)-4-(1-methylethenyl)benzene} represented by the chemical formula (8).

Next, this obtained 1-(1-alkoxyalkoxy)-4-(1-methylethenyl)benzene is subjected to an anionic polymerization in the presence of an organic alkali metal compound.

The 1-(1-alkoxyalkoxy)-4-(1-methylethenyl)benzene can be used for the anionic polymerization with the isolation from a reaction solution obtained by the above-mentioned reaction, by subjecting the same to a usual treatment such as extraction, distillation and/or crystallization. Alternatively, the 1-(1-alkoxyalkoxy)-4-(1-methylethenyl)benzene can be used for the anionic polymerization without the isolation after the acid has been removed by a usual operation such as extraction, neutralization, filtration or ion exchange resin treatment. In addition, the 1-(1-alkoxyalkoxy)-4-(1-methylethenyl)benzene is preferably stored after an alkali component such as potassium hydroxide or sodium carbonate has been added thereto as a stabilizer, and it can also directly be used for the anionic polymerization without the removal of this alkali component.

Furthermore, the 1-(1-alkoxyalkoxy)-4-(1-methylethenyl)benzene can be used singly, but two or more kinds of 1-(1-alkoxyalkoxy)-4-(1-methylethenyl)benzenes can also be used to carry out a copolymerization.

In the anionic polymerization in the process of the present invention, an organic alkali metal compound can be used as a polymerization initiator. Examples of the referable organic alkali metal compound include a compound

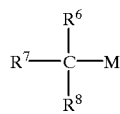

represented by the chemical formula (9)
wherein $R^6$ and $R^7$ are each independently an alkyl group having 1 to 10 carbon atoms, an un-substituted or alkyl-substituted aryl group having 6 to 12 carbon atoms; $R^8$ is hydrogen or an alkyl group having 1 to 10 carbon atoms; and M is an alkali metal selected from the group consisting of lithium, sodium, potassium and cesium, a compound represented by the chemical formula (10)

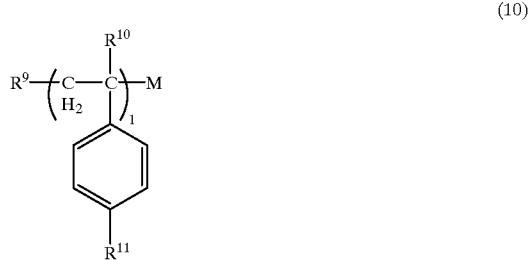

wherein $R^9$ is hydrogen or an alkyl group having 1 to 10 carbon atoms; $R^{10}$ is an alkyl group having 1 to 3 carbon atoms, or an un-substituted or alkyl-substituted aryl group having 6 to 12 carbon atoms; $R^{11}$ is hydrogen or an alkyl group, an alkoxy group or an alkoxyalkoxy group having 1 to 10 carbon atoms; M is an alkali metal selected from the group consisting of lithium, sodium, potassium and cesium; and l is an integer of 1 to 200, a compound represented by the chemical formula (11)

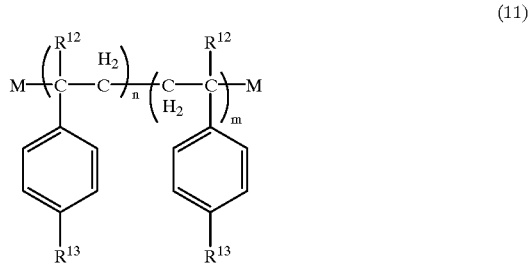

wherein $R^{12}$ is an alkyl group having 1 to 3 carbon atoms; $R^{13}$ is hydrogen or an alkyl group, an alkoxy group or an alkoxyalkoxy group having 1 to 10 carbon atoms; M is an alkali metal selected from the group consisting of lithium, sodium, potassium and cesium; m and n are each an integer of 1 to 100, or a compound represented by the chemical formula (12)

wherein Ar is an organic group selected from the group consisting of naphthalene, anthracene, indene, cyclopenta-diene and fluorene; and M is an alkali metal selected from the group consisting of lithium, sodium, potassium arid cesium. Examples of the more preferable organic alkali metal compound include sec-butyl lithium, α-methylstyrene dimer dipotassium, α-methylstyrene tetramer disodium, cumyl potassium, cumyl cesium, sodium naphthalene and anthracene sodium.

Moreover, a combination of components capable of generating the organic alkali metal compound under polymerization conditions such as a combination of cumene and an alkali metal can also be used, and the organic alkali metal compound separately prepared can further be used without its isolation.

The amount of the organic alkali metal compound depends on its kind and the molecular weight of the desired poly{1-(1-alkoxyalkoxy)-4-(1-methylethenyl)benzene}, but usually, it is 0.5 mol or less, preferably in the range of 0.00001 to 0.1 mol, more preferably in the range of 0.0001 to 0.05 mol per mol of this polymer.

The anionic polymerization in the process of the present invention is preferably carried out in an organic solvent. Examples of the organic solvent which can be used in this case include aliphatic and alicyclic hydrocarbons such as n-hexane, n-pentane, n-heptane and cyclo-hexane; aromatic hydrocarbons such as benzene, toluene, ethylbenzene and cumene; and ethers such as diethyl ether, diphenyl ether, tetrahydrofuran, 1,4-dioxane, ethylene glycol dimethyl ether and ethylene glycol diethyl ether. They may be used singly or in the state of a mixture of two or more thereof. In the case that the above-mentioned solvent is used in the reaction of the present invention, it is preferable to use the same solvent also in the anionic polymerization, because an operation such as the recovery of the solvent can be omitted.

No particular restriction is put on the practical system of the anionic polymerization in the process of the present invention, and any system can be used, so long as it can effectively mix and contact 1-(1-alkoxyalkoxy)-4-(1-methylethenyl)benzene, the organic alkali metal compound and the solvent if any. Any of a batch system, a semi-batch system and a continuous stream system is usable.

The temperature and the time of the anionic polymerization depend on the kinds and the amounts of the 1-(1-alkoxyalkoxy)-4-(1-methylethenyl)benzene which is the starting material, the organic alkali metal compound and the solvent which may be used. However, the reaction temperature is usually in the range of −100° C. to 150° C., preferably −80 to 80° C. The reaction time is usually within 100 hours, and preferably 0.01 to 20 hours. The polymerization can be carried out under any of reduced pressure, atmospheric pressure and increased pressure.

The anionic polymerization in the process of the present invention is carried out under the atmosphere of an inert gas such as argon or nitrogen.

Furthermore, in the anionic polymerization in the process of the present invention, some additives such as a crown ether and a polyglycol which have been used so far in the anionic polymerization can be further used in order to enhance a polymerization rate, a polymerization yield and the like.

By the above-mentioned operation, the polymerization is selectively accomplished through the vinyl group of tile 1-(1-alkoxyalkoxy)-4-(1-methylethenyl)benzene.

At a time when a desired polymerization degree has been attained, a polymerization terminator is added to the reaction system to terminate the polymerization, whereby there can be obtained a poly{1-(1-alkoxyalkoxy)-4-(1-methylethenyl)benzene} having a weight-average molecular weight of 2,000 to 100,000 and a weight-average molecular weight/number-average molecular weight ratio of 1.6 or less, preferably a poly{1-(1-alkoxyethoxy)-4-(1-methylethenyl)benzene} or a poly{1-(2-tetrahydrofuranyloxy)-4-(1-methylethenyl)benzene}.

As the polymerization terminator, a usual anionic polymerization terminator can be used, and examples of the usable polymerization terminator include water; alcohols such as methanol and ethanol; alkyl halides such as methyl bromide and methyl iodide; and organic carbonic acids such as acetic acid and propionic acid. In addition, after the polymerization, the polymer can be treated with carbon dioxide or a circular ether compound such as ethylene oxide or propylene oxide, and further treated with the above-mentioned polymerization terminator, whereby a functional group such as a carboxyl group or a hydroxyl group can be introduced into the chain terminal of the polymer. If necessary, a known terminal modifier, terminal branching agent, coupling agent and the like can also be used.

The obtained poly{1-(1-alkoxyalkoxy)-4-(1-methylethenyl)benzene} having a narrow molecular weight distribution can be isolated and purified by a usual technique such as a method which comprises precipitation by the use of a suitable solvent such as methanol, washing and drying, or a method which comprises the elimination of the solvent and a drying operation such as steam stripping drying or heating/drying.

In the method of the present invention, in order to obtain the desired poly{4-(1-methylethenyl)phenol} from this obtained poly{1-(1-alkoxyalkoxy)-4-(1-methylethenyl)benzene}, a poly{1-(1-alkoxyalkoxy)-4-(1-methylethenyl)benzene} is first brought into contact with a protonic acid in the presence of an organic solvent to carry out an alkoxyalkoxy group elimination reaction.

The poly{1-(1-alkoxyalkoxy)-4-(1-methylethenyl)benzene} can be used after the isolation and purification as described above, and it can be directly used as it is for the alkoxyalkoxy group elimination reaction without any operation of the isolation.

Examples of the protonic acid include hydrogen halides such as hydrogen chloride, mineral acids such as hydrochloric acid, hydrobromic acid, nitric acid, sulfuric acid and phosphoric acid, carboxylic acids such as trichloroacetic acid, trifluoroacetic acid, oxalic acid, acetic acid and malonic acid, and organic sulfonic acids such as p-toluenesulfonic acid and trifluoromethylsulfonic acid, and above all, hydrogen chloride, hydrochloric acid, sulfuric acid, trifluoroacetic acid, p-toluenesulfonic acid and trifluoromethylsulfonic acid are preferable. The amount of the protonic acid to be used is usually in the range of 0.00001 mol or more per mol of the repeating unit represented by the chemical formula (1) in the poly{1-(1-alkoxyalkoxy)-4-(1-methylethenyl)benzene}, but for example, a carboxylic acid such as acetic acid can also be used as the organic solvent. Preferably, the amount of the protonic acid is in the range of 0.00001 to 0.5 mol, preferably 0.0001 to 0.2 mol per mol of the repeating unit.

As the organic solvent, any solvent can be used, so long as it can dissolve at least one of the poly{1-(1-alkoxyalkoxy)-4-(1-methylethenyl)benzene} to be used or the produced poly{4-(1-methylethenyl)phenol}. In general, examples of the organic solvent include aliphatic and alicyclic hydrocarbons such as n-hexane, n-pentane, n-heptane and cyclohexane; aromatic hydrocarbons such as benzene, toluene, ethylbenzene and cumene; aliphatic and aromatic halogen compounds such as dichloromethane, chloroform, chlorobenzene and dichlorobenzene; alcohols such as methanol, ethanol, n-propanol, iso-propanol, n-butanol, tertbutanol, amyl alcohol, cyclohexanol and ethylene glycol; ethers such as diethyl ether, diphenyl ether, tetrahydrofuran, 1,4-dioxane, ethylene glycol dimethyl ether and ethylene glycol diethyl ether; ketones such as acetone, ethyl methyl ketone, 2-pentanone, 2-hetanone and acetophenone; nitriles such as acetonitrile and propionitrile; and esters such as ethyl acetate, ethyl propionate and ethyl lactate. In addition, a carboxylic acid such as acetic acid which can be used as the protonic acid is also usable. These organic solvents may be used singly or in the form of a mixture of two or more thereof. The amount of the solvent to be used depends on the kind of solvent to be used, but in general, the amount is such that the concentration of the poly{1-(1-alkoxyalkoxy)-4-(1-methylethenyl)benzene} to be used or prepared poly{4-(1-methylethenyl)phenol} is in the range of 0.05 to 500% by weight, preferably 0.1 to 30% by weight.

No particular restriction is put on a practical system of the alkoxyalkoxy group eliminating reaction in the process of the present invention, and any system can be used, so long as it can effectively mix and contact the poly{1-(1-alkoxyalkoxy)-4-(1-methylethenyl)benzene}, the protonic acid, the organic solvent and the like. Any of a batch system, a semi-batch system and a continuous stream system is usable.

The temperature and time of the alkoxyalkoxy group eliminating reaction depend on the concentration and molecular weight of the poly{1-(1-alkoxyalkoxy)-4-(1-methylethenyl)benzene}, the kind and amount of the protonic acid, and the kind of organic solvent. However, the temperature of the alkoxyalkoxy group eliminated reaction is usually in the range of 0 to 200° C., preferably 20 to 150° C. The reaction time of the alkoxyalkoxy group eliminating reaction is usually within 20 hours, preferably in the range of 0.01 to 10 hours. The reaction can be carried out under any of reduce pressure, atmospheric pressure and increased pressure.

This alkoxyalkoxy group eliminating reaction can be carried out under an inert gas atmosphere or in the presence of molecular oxygen such as air.

By the above-mentioned operation, poly{4-(1-methylethenyl)phenol} having a narrow molecular weight distribution and a repeating unit represented by the chemical formula (13)

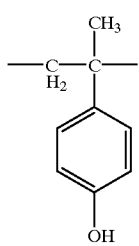

(13)

can be obtained. Poly{4-(1-methylethenyl)phenol} having the narrow molecular weight distribution obtained by the process of the present invention has a weight-average molecular weight of 1,000 to 80,000, preferably 2,000 to 50,000, more preferably 3,000 to 30,000 and weight-average molecular weight/number-average molecular weight ratio of 1.6 or less, preferably in the range of 1.0 to 1.5

For example, in the case that an organic solvent having a low solubility such as a hydrocarbon is used in the alkoxyalkoxy group eliminating reaction, this obtained poly{4-(1-methylethenyl)phenol} is precipitated in the form of a solid during the alkoxyalkoxy group eliminating reaction, so that it can be easily isolated by a usual separating operation such as filtration or decantation. On the other hand, in the case that an organic solvent having a high solubility such as the alcohol is used, poly{4-(1-methylethenyl)phenol} is uniformly dissolved. Therefore, the isolation of poly{4-(1-methylethenyl)phenol} can be accomplished by a method which comprises precipitating and then separating the same by the use of a suitable poor solvent after a usual purifying operation such as extraction, stripping or ion exchange or without any purifying operation, or a usual. method such as a desolvation method in which a drying operation is used.

The poly{1-(1-alkoxyalkoxy)-4-(1-methylethenyl)benzene} obtained by the present invention is useful as a material for a resist composition. For example, it can be used as a positive resist composition together with an acid generator and a solvent. Here, the acid generator is a substance which can generate a Bronsted acid or a Lewis acid when exposed to an activated radiation such as an excimer laser. In addition, to this resist composition, some additives can be added, and examples of the additives include a dissolution rate adjustor, a surface active agent, a storage stabilizer, a sensitizer and a striation inhibitor. For example, this resist composition can be applied onto the surface of a silicon wafer or the like in a usual manner such as spin coating, and the used solvent is then removed by drying to form a resist film thereon. Furthermore, after the formation of a pattern, exposure is carried out by irradiating the resist film with far ultraviolet rays, a KrF excimer laser or electron rays, and a heat treatment (baking after the exposure) is done, thereby more heightening a sensitivity. Next, an exposed portion is washed out with a developing solution such as an aqueous alkali solution to obtain a relief pattern. The relief pattern formed by the use of the poly{1-(1-alkoxyalkoxy)-4-(1-methylethenyl)benzene} according to the present invention is extremely excellent in definition and contrast. Furthermore, the pattern formed by the above-mentioned procedure can also be used as a mask through which a substrate is etched.

Poly{4-(1-methylethenyl)phenol} obtained by the process of the present invention can be used as a positive resist material component, for example, after part of hydroxyl groups are replaced with acid dissociating groups. Alternatively, poly{4-(1-methylethenyl)phenol} can be used as a negative resist composition together with a sensitizer such as an azido compound, and as a positive resist composition together with a composition having a dissolution inhibiting ability.

According to the present invention, a poly{1-(1-alkoxyalkoxy)-4-(1-methylethenyl)benzene} which is useful as a chemical amplification type positive resist material can be easily prepared in a high yield as a polymer having an optional molecular weight and a narrow molecular weight distribution by reacting industrially easily available 4-(1-methylethenyl)phenol with a vinyl ether to form an alkoxyalkoxy compound, and then subjecting this compound to an anionic polymerization. In addition, poly{4-(1-methylethenyl)phenol} which is useful as a base polymer for a resist material can be easily prepared in a high yield as a polymer having an optional molecular weight and a narrow molecular weight distribution by reacting the above-mentioned polymer with a protonic acid in the presence of an organic solvent.

Next, the present invention will be described in more detail in accordance with examples, but it should be understood that these examples are not restrictive but explanatory.

EXAMPLE 1

Synthesis of 1-(1-ethoxyethoxy)-4-(1-methylethenyl)benzene

In a 200 ml four-necked flask equipped with a stirrer, a thermometer, a dropping funnel and a condenser were placed 10.0 g (74.6 mmol) of 4-(1-methylethenyl)phenol, 10 mg (0.04 mmol) of p-toluenesulfonic acid pyridine salt as an acid and 80.0 ml of methylene chloride as a solvent.

This solution was heated with stirring, and when its internal temperature reached 25° C., a solution prepared by dissolving 5.41 g (75.0 mmol) of ethyl vinyl ether in 20 ml of methylene chloride was added dropwise thereto through the dropping funnel. After the dropping over 10 minutes, reaction was carried out in situ for 1 hour under an air atmosphere. At the start of the dropping, the color of the solution was light yellow, but at the completion of the reaction, it was colorless and transparent. During the dropping, the generation of heat was slightly observed. After the completion of the reaction, this reaction solution was transferred to a separatory funnel, and then washed once with 100 ml of a 0.2 N aqueous sodium hydroxide solution and further washed twice with 100 ml of ion exchanged water to remove the acid component. On the other hand, an alkali liquor used for extraction was mixed with water, reverse extraction was then carried out with methylene chloride which was a reaction solvent, and the resultant extract was then mixed with a first organic layer. The thus obtained organic solution was dried over anhydrous sodium sulfate, and component analysis was made by a high-speed liquid chromatography. As a result, it was apparent that 14.7 g (71.1 mmol) of desired 1-(1-ethoxyethoxy)-4-(1-methylethenyl)benzene and 0.09 g (0.67 mmol) of 4-(1-methylethenyl)phenol which was the starting material were contained in the solution. Hence, the conversion of 4-(1-methylethenyl)phenol was 99.1%, and the yield of 1-(1-ethoxyethoxy)-4-(1-methylethenyl)benzene to fed 4-(1-methylethenyl)phenol was 95.4%.

Figure 2:
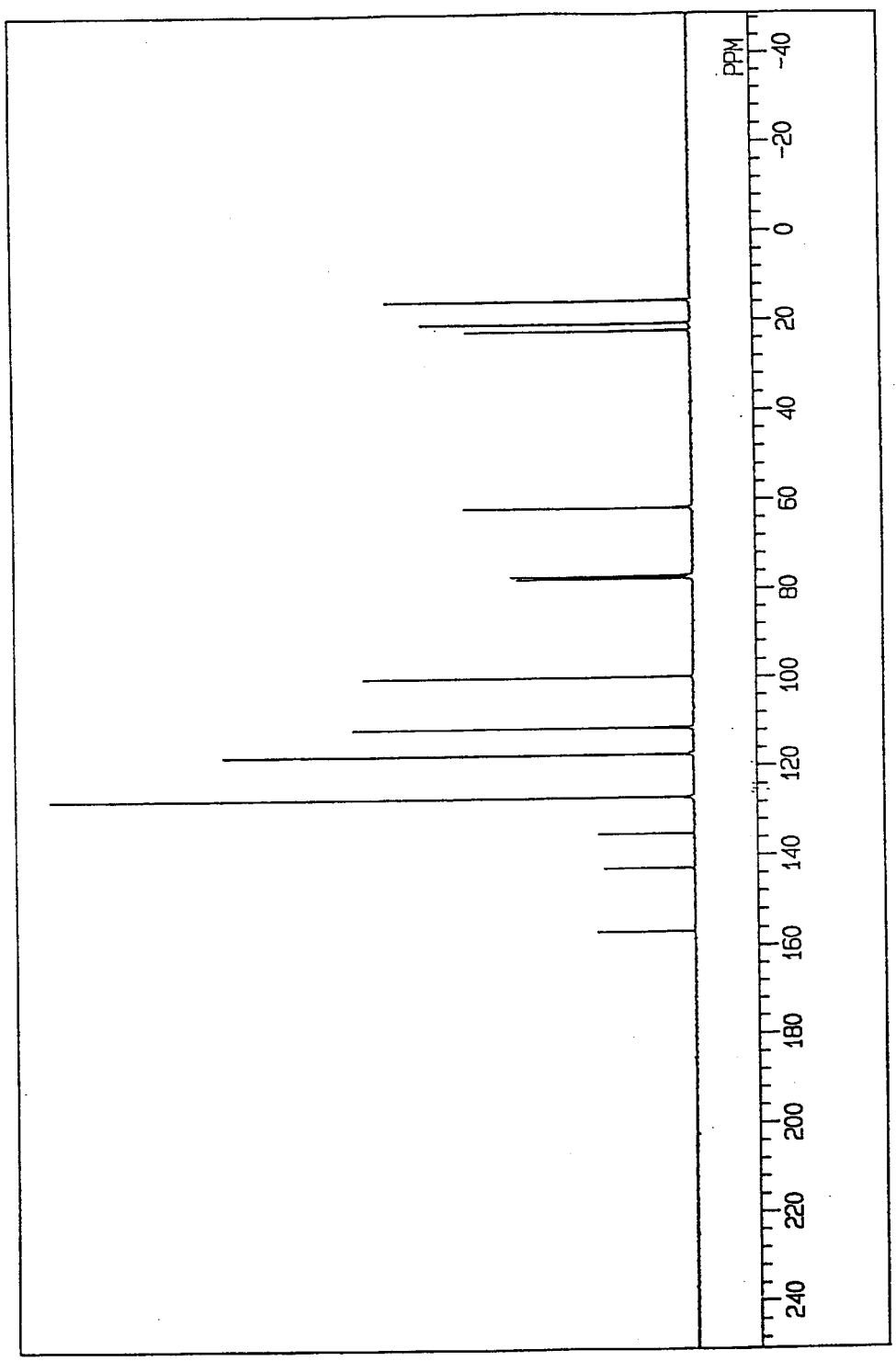
FIG. 2 is a $^{13}$C-NMR spectrum, in CDCl$_3$, of 1-(1-ethoxyethoxy)-4-(1-methylethenyl)benzene synthesized in Example 1.
Figure 3:
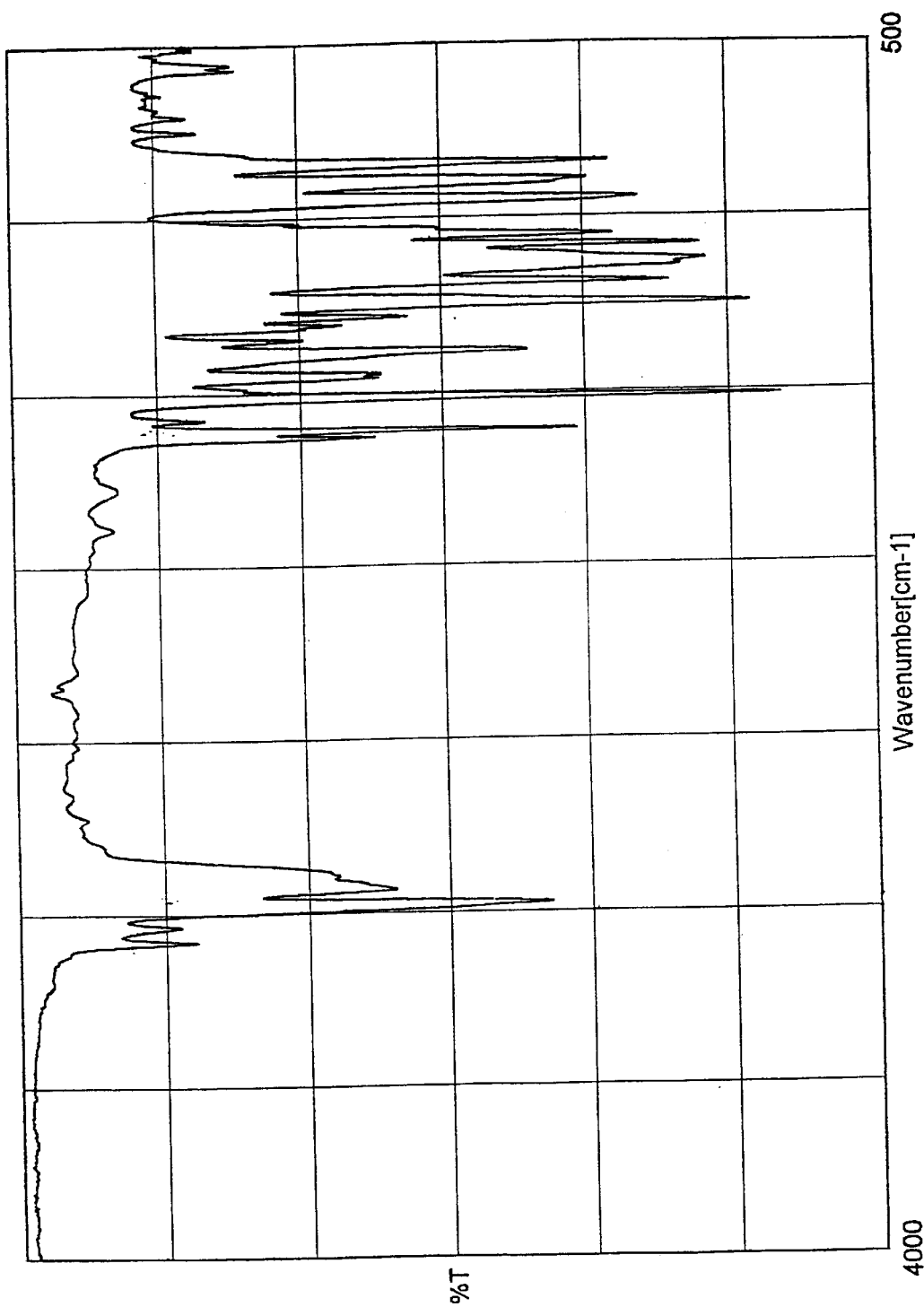
FIG. 3 is an IR spectrum of 1-(1-ethoxyethoxy)-4-(1-methylethenyl)benzene synthesized in Example 1.

After methylene chloride was distilled off from the obtained solution subjected to the alkali treatment, produced 1-(1-ethoxyethoxy)-4-(1-methylethenyl)benzene was distilled at 60° C. under 0.5 mmHg in the presence of calcium hydride to purify it. Its yield was 13.2 g. In addition, produced 1-(1-ethoxyethoxy)-4-(1-methylethenyl)benzene was identified by $^1$H-NMR, $^{13}$C-NMR, IR and elemental analysis. $^1$H-NMR in CDCl$_3$ is shown in FIG. 1, $^{13}$C-NMR is shown in FIG. 2, and IR is shown in FIG. 3. Moreover, the results of the elemental analysis were C:75.54%, H:8.91% and N:0.00%, which closely corresponded to calculated values (C:75.69% H:8.79% and N:0.00%).

Synthesis of poly{1-(1-ethoxyethoxy)-4-(1-methylethenyl)benzene}

Figure 4:
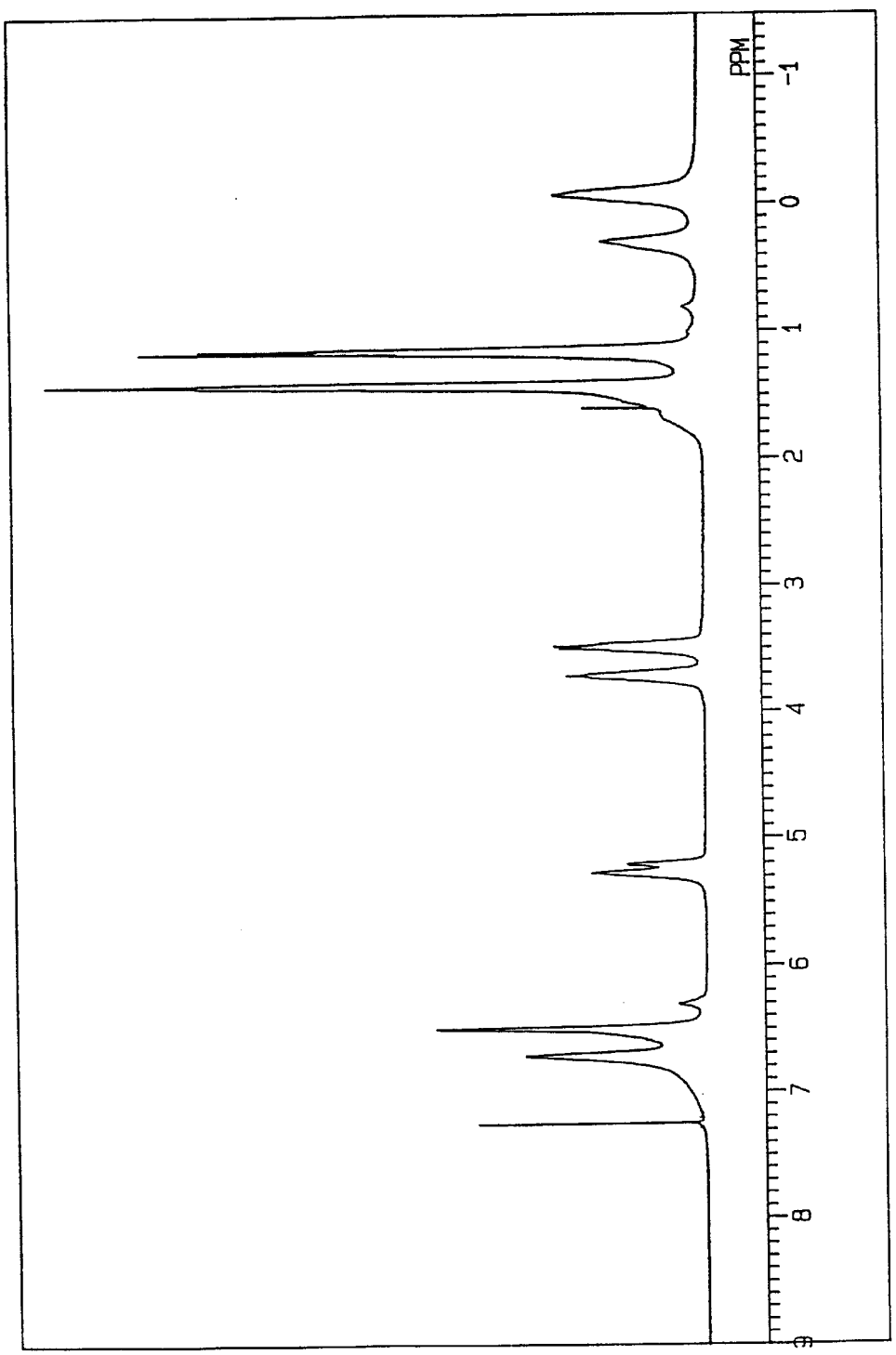
FIG. 4 is a $^1$H-NMR spectrum, in CDCl$_3$, of poly{1-(1-ethoxyethoxy)-4-(1-methylethenyl)benzene) synthesized in Example 1.
Figure 5:
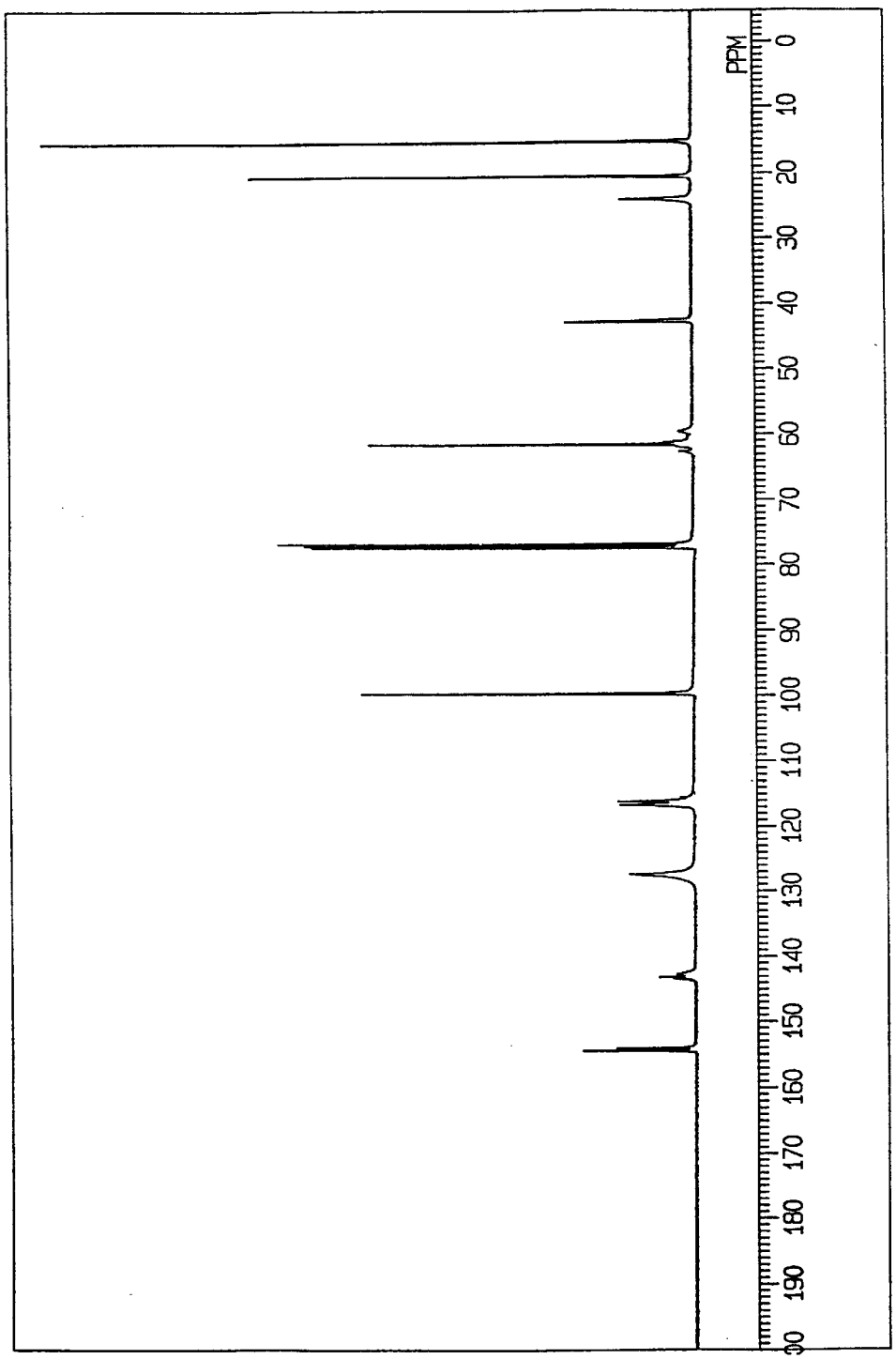
FIG. 5 is a $^{13}$C-NMR spectrum, in CDCl$_3$, of poly{1-(1-ethoxyethoxy)-4-(1-methylethenyl)benzene} synthesized in Example 1.
Figure 6:
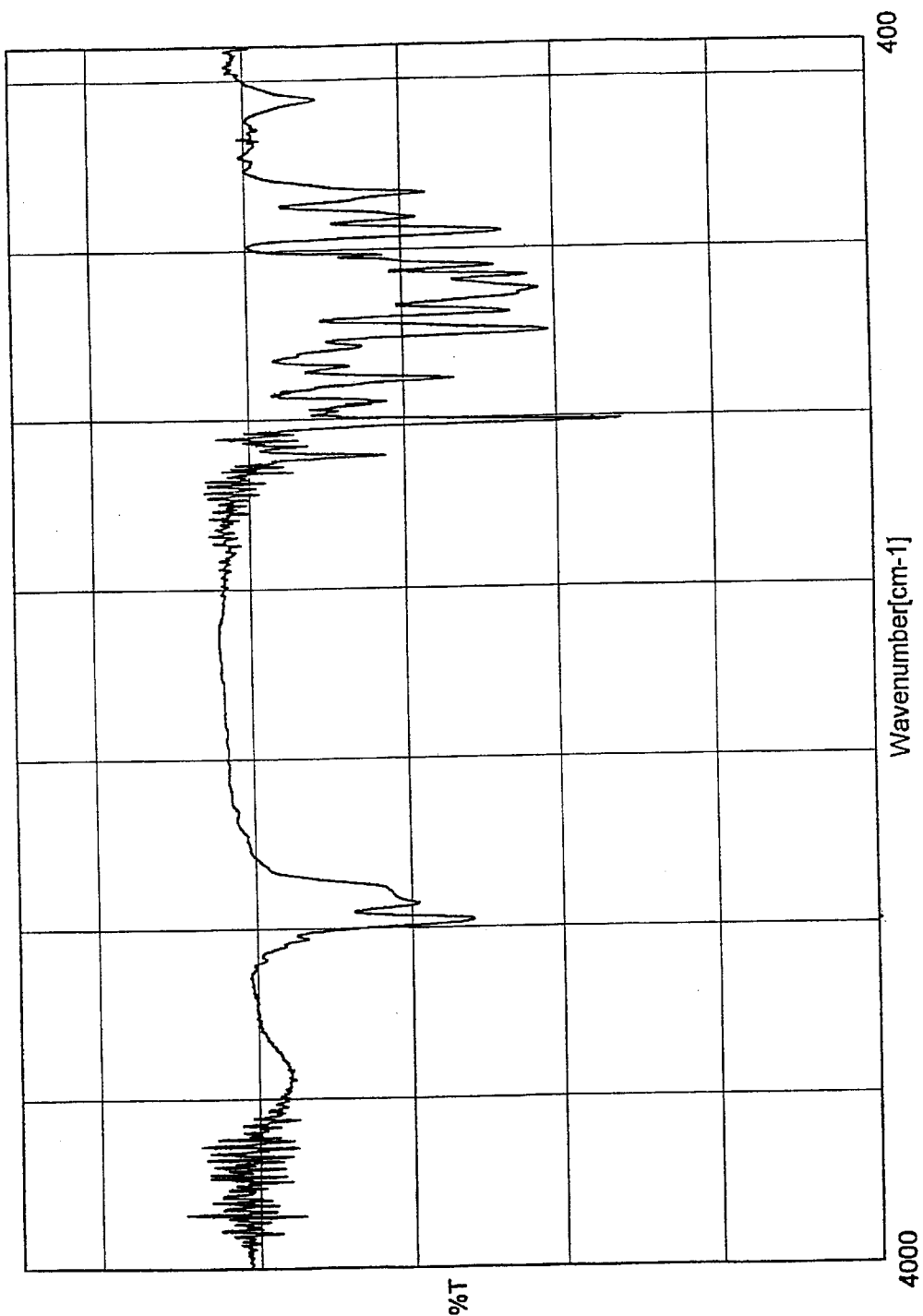
FIG. 6 is an IR spectrum of poly{1-(1-ethoxyethoxy)-4-(1-methylethenyl)benzene} synthesized in Example 1.
Figure 7:
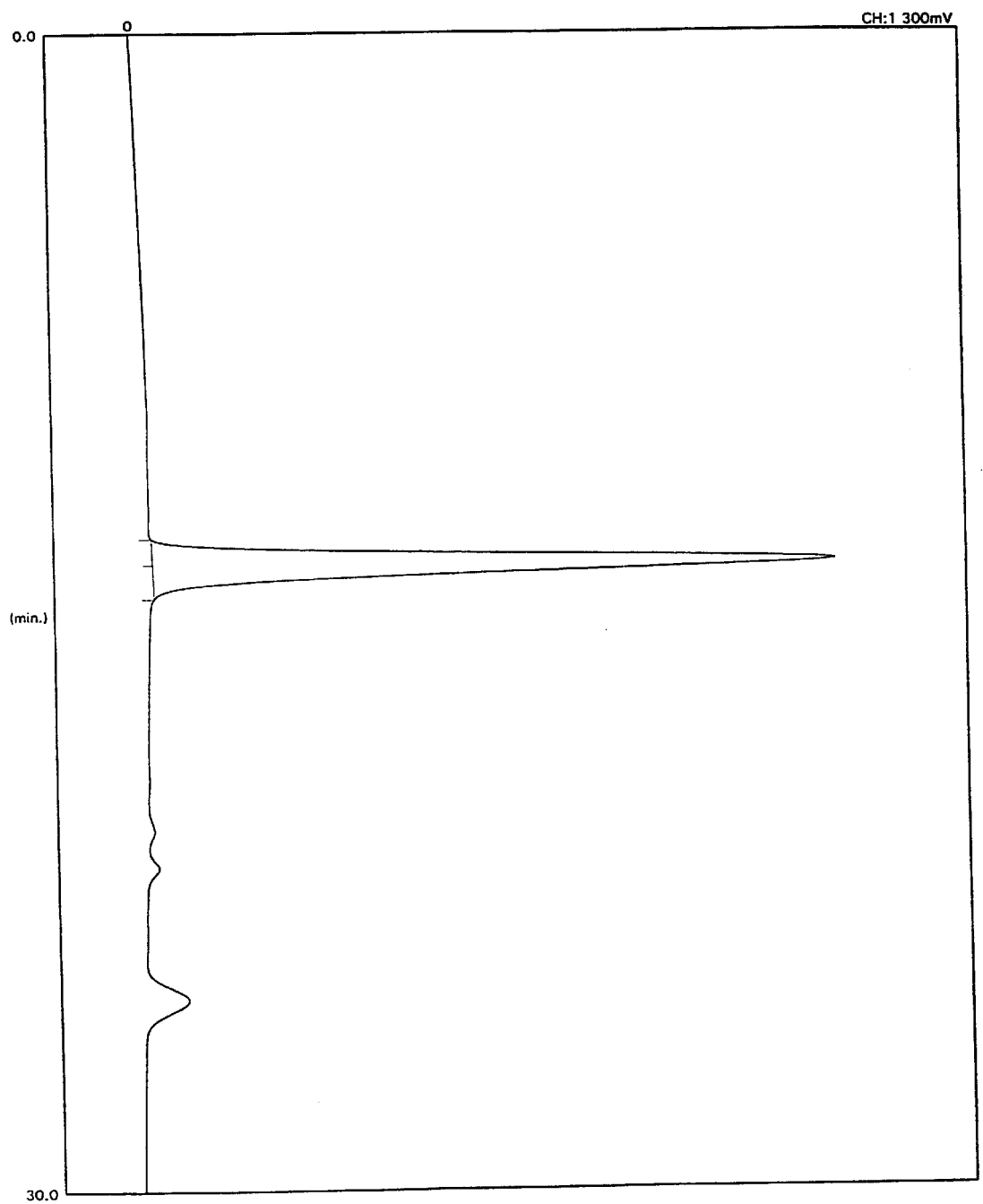
FIG. 7 is a GPC elution curve of poly{1-(1-ethoxyethoxy)-4-(1-methylethenyl)benzene} synthesized in Example 1.

A stirrer was put in a 200 ml Schlenk type flask under an argon atmosphere, and 100 ml of tetrahydrofuran as a solvent and 0.52 ml (0.56 mmol) of a 1.08 N cyclohexane solution of sec-butyl lithium as a polymerization initiator were then fed to the flask. After this solution was cooled to −78° C. with stirring, 10.0 g (48.5 mmol) of distilled/purified 1-(1-ethoxyethoxy)-4-(1-methylethenyl)benzene was added thereto. Immediately, this solution assumed deep red. After polymerization was carried out in situ for 6 hours, 5.0 ml of methanol was added to terminate the polymerization. This polymerization solution was poured into 2.0 L of methanol to precipitate the resultant polymer, and this polymer was filtered/separated and then dried under reduced pressure to obtain 9.62 g of the white polymer. The weight yield of the polymer to fed 1-(1-ethoxyethoxy)-4-(1-methylethenyl)benzene was 96.2%. It was confirmed by the results of $^1$H-NMR analysis, $^{13}$C-NMR analysis, IR analysis and elemental analysis that the obtained white polymer was poly{1-(1-ethoxyethoxy)-4-(1-methylethenyl)benzene} desired. $^1$H-NMR in CDCl$_3$ is shown in FIG. 4, $^{13}$C-NMR is shown in FIG. 5 and IR is shown in FIG. 6. Moreover, the results of the elemental analysis were C:75.44%, H:8.95% and N:0.00%, which closely corresponded to calculated values (C:75.69%, H:8.79% and N:0.000%). In addition, the results of GPC analysis on the basis of polystyrene standard indicate that the obtained polymer had a weight-average molecular weight (Mw) of 18000 and a molecular weight dispersion ratio (Mw/Mn) of 1.02. The results of the GPC analysis are shown in FIG. 7.

Synthesis of poly{4-(1-methylethenyl)phenol}

In a 100 ml Erlenmeyer flask including a stirrer were placed 5.00 g of synthesized poly{1-(1-ethoxyethoxy)-4-(1-methylethenyl)benzene} and 30 ml of methanol as a solvent. In this state, the polymer was scarcely dissolved, so that the solution was nonuniform, but 0.1 ml of a 35% aqueous hydrochloric acid solution was added, followed by stirring at room temperature for 3 hours to carry out acid treatment. By the addition of the aqueous hydrochloric acid solution, insolubles were gradually decreased, and after 3 hours, the solution became colorless and transparent.

Figure 8:
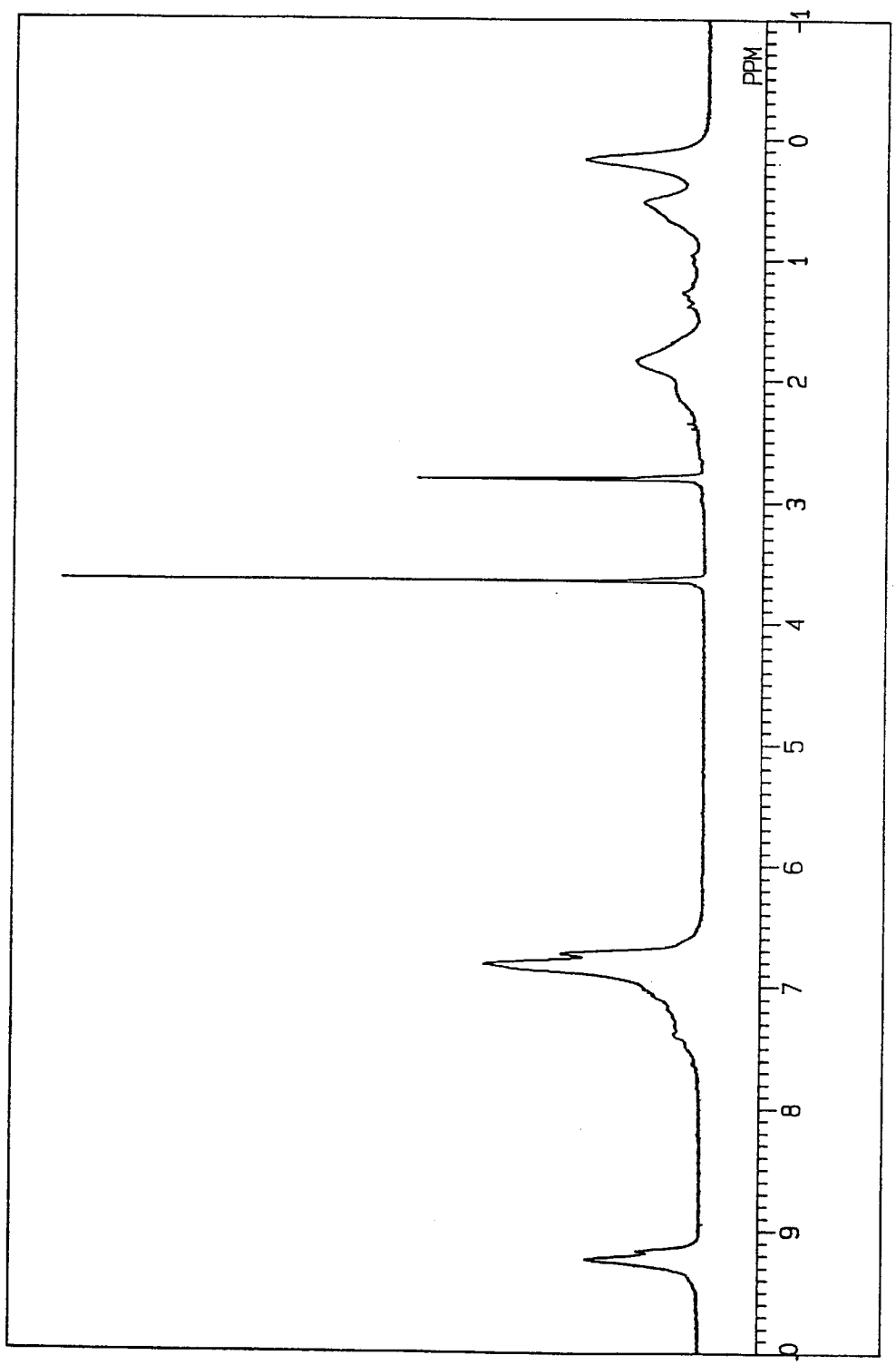
FIG. 8 is a $^1$H-NMR spectrum, in d$_6$-DMSO, of poly{4-(1-methylethenyl)phenol} synthesized in Example 1.
Figure 9:
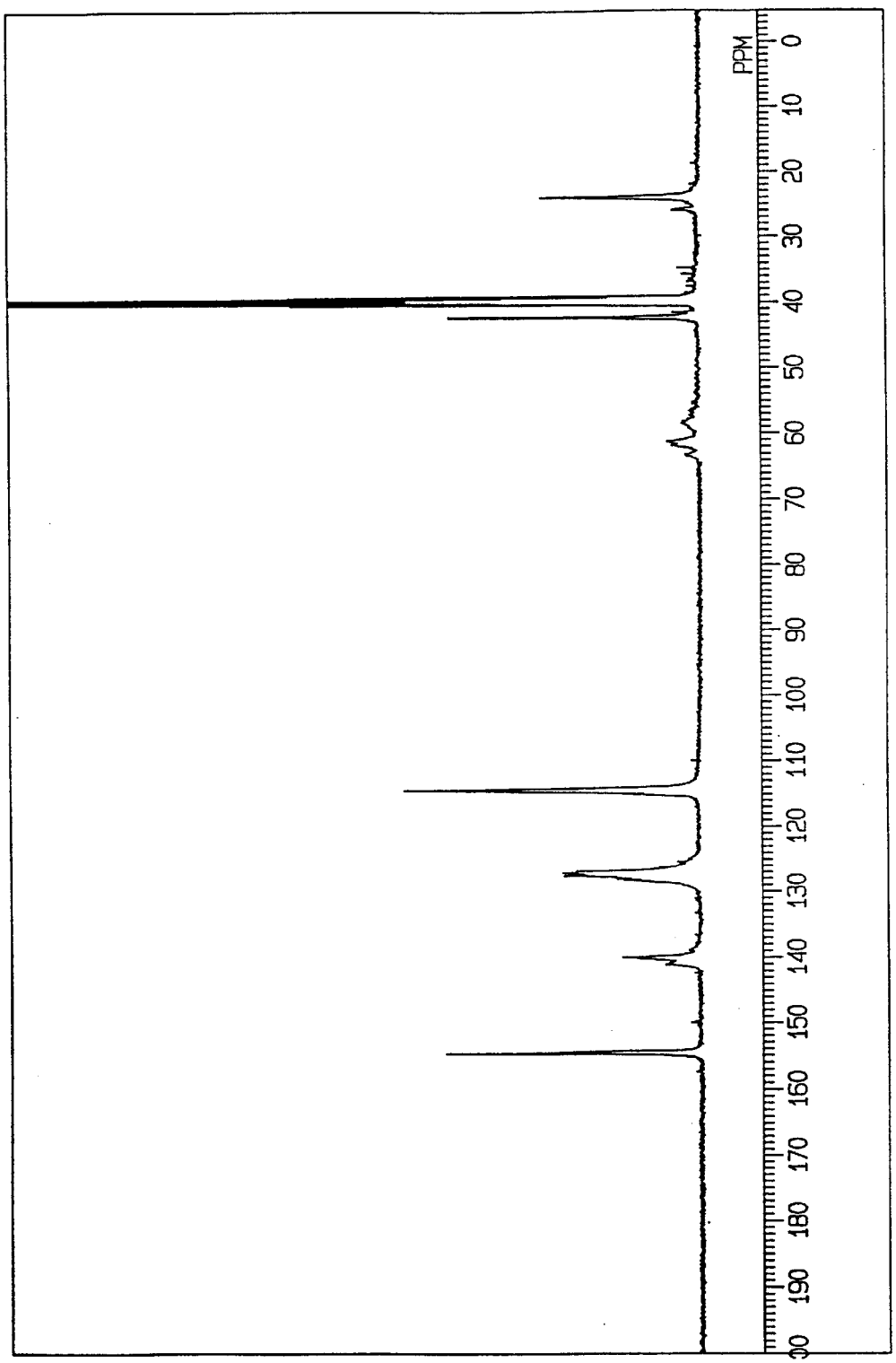
FIG. 9 is a $^{13}$C-NMR spectrum, in d$_6$-DMSO, of poly{4-(1-methylethenyl)phenol} synthesized in Example 1.
Figure 10:
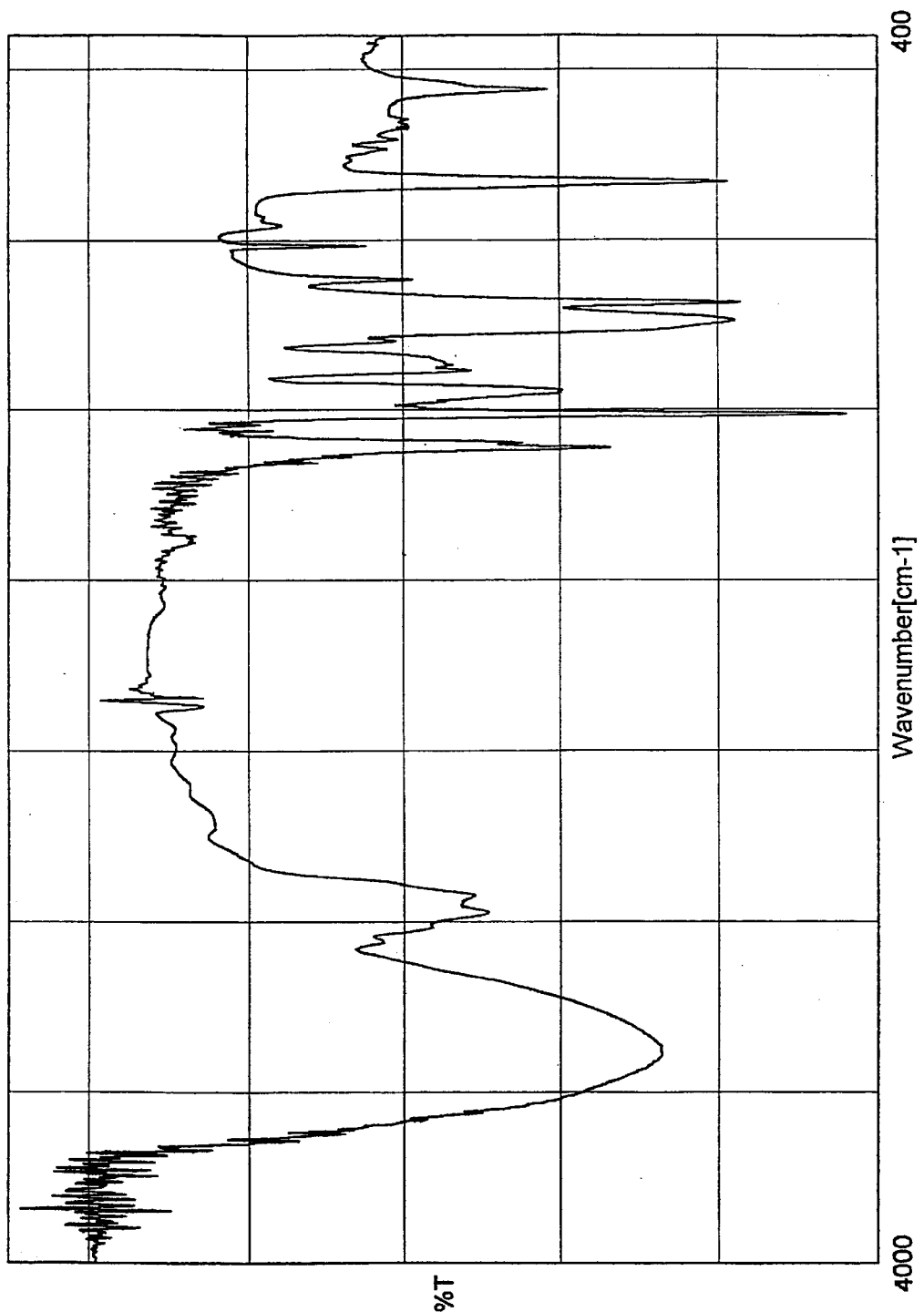
FIG. 10 is an IR spectrum of poly{4-(1-methylethenyl)phenol} synthesized in Example 1.
Figure 11:
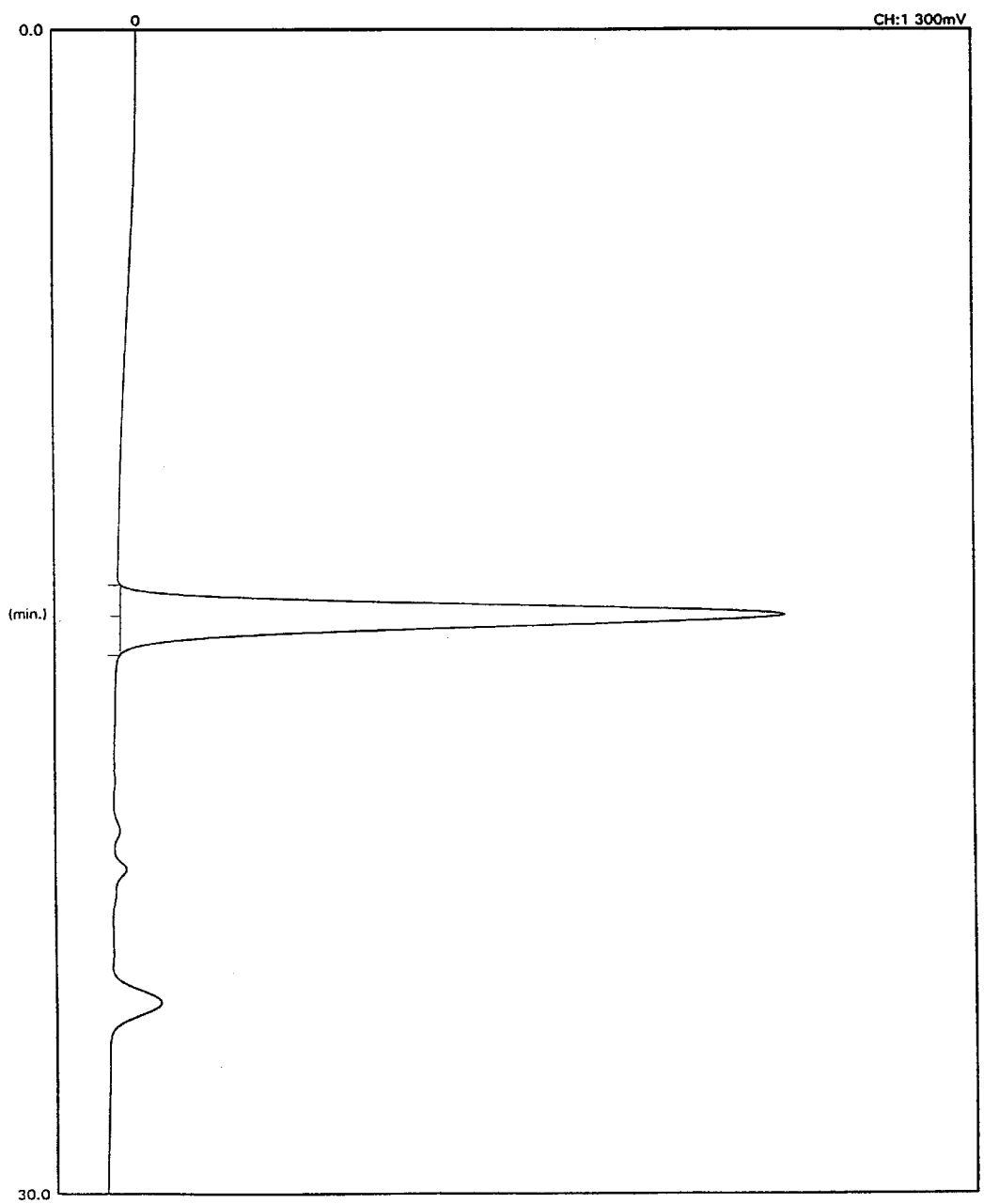
FIG. 11 is a GPC elution curve of poly{4-(1-methylethenyl)phenol} synthesized in Example 1.

This solution subjected to the acid treatment was poured into 500 ml of water to precipitate the resultant polymer, and this polymer was filtered/separated and then dried under reduced pressure to obtain 2.9 g of the white polymer. It was confirmed by the results of $^1$H-NMR analysis, $^{13}$C-NMR analysis, IR analysis and elemental analysis that the obtained white polymer was poly{4-(1-methylethenyl) phenol} desired. $^1$H-NMR in d$_6$-DMSO is shown in FIG. 8, $^{13}$C-NMR is shown in FIG. 9, and IR is shown in FIG. 10. Moreover, the results of the elemental analysis were C:80.33%, H:7.73% and N:0.00%, which closely corresponded to calculated values (C:80.56%, H:7.51% and N:0.00%). The results of GPC Analysis on the basis of polystyrene standard indicate that the obtain polymer had a weight-average molecular weight (Mw) of 14000 and a molecular weight dispersion ratio (Mw/Mn) of 1.02. The results of the GPC analysis are shown in FIG. 11.

Comparative Example 1

Reaction was carried out by the same procedure as in Example 1 except that p-toluenesulfonic acid pyridine salt was not used as an acid, and alkali extraction and drying were done in the same manner as in Example 1 to obtain an alkali-treated solution. The same analysis as in Example 1 was made, but the production of desired 1-(1-ethoxyethoxy)-4-(1-methylethenyl)benzene was not observed.

EXAMPLES 2 to 8

Synthesis of 1-(1-ethoxyethoxy)-4-(1-methylethenyl)benzene

Reaction was carried out by the same procedure as in Example 1 except that the kind and the amount of an acid, the kind of solvent, a reaction temperature and a reaction time were changed as shown in Table 1, and alkali extraction and drying were done in the same manner as in Example 1 to obtain an alkali-treated solution. The same analysis as in Example 1 was made to obtain the conversion of 4-(1-methylethenyl)phenol and the yield of 1-(1-ethoxyethoxy)-4-(1-methylethenyl)benzene to 4-(1-methylethenyl)phenol. The results are shown in Table 1 in which the results of Example 1 are described.

TABLE 1

| Example | Kind of Acid | Amount of Acid (mmol) | Solvent |
|---|---|---|---|
| 1 | p-Toluenesulfonic acid pyridine salt | 0.04 | Methylene chloride |
| 2 | p-Toluenesulfonic acid pyridine salt | 0.4 | Methylene chloride |
| 3 | p-Toluenesulfonic acid pyridine salt | 4.0 | Methylene chloride |
| 4 | p-Toluenesulfonic acid pyridine salt | 0.04 | Tetrahydrofuran |
| 5 | Trifluoroacetic acid | 0.001 | Acetonitrile |
| 6 | 1.0 N Hydrogen chloride-ether solution | 0.005 | Diethyl ether |
| 7 | Sulfuric acid pyridine salt | 0.5 | Acetone |
| | Dodecatungstophosphoric acid | 1.0 | Methylene chloride |

| Example | Reaction Temp. (° C.) | Reaction Time (min) | Conversion (%) | Yield (%) |
|---|---|---|---|---|
| 1 | 25 | 60 | 99.1 | 95.4 |
| 2 | 15 | 30 | 99.8 | 96.2 |
| 3 | 0 | 20 | 99.4 | 94.4 |
| 4 | 15 | 120 | 97.8 | 94.4 |
| 5 | 0 | 60 | 99.3 | 91.0 |
| 6 | 0 | 30 | 95.8 | 88.9 |
| 7 | 25 | 60 | 87.6 | 82.2 |
| 8 | 25 | 120 | 85.4 | 80.3 |

EXAMPLE 9

Synthesis of poly{1-(1-ethoxyethoxy)-4-(1-methylethenyl)benzene}

In the same polymerization vessel as in Example 1 were placed 100 ml of benzene as a solvent and 1.7 ml (0.34 mmol) of a 0.2 N tetrahydrofuran solution of cumyl potassium separately prepared as a polymerization initiator.

This solution was heated with stirring, and when its internal temperature reached 35° C., 10.0 g (48.5 mmol) of 1-(1-ethoxyethoxy)-4-(1-methylethenyl)benzene synthesized and distilled/purified in the same manner as in Example 1 was then added to the solution. After polymerization was carried out in situ for 5 hours, 5.0 ml of methanol was added thereto to terminate the polymerization. This polymerization solution was poured into 2.0 l of methanol to precipitate the polymer, and this polymer was filtered/separated, and then dried under reduced pressure to obtain 6.96 g of poly{1-(1-ethoxyethoxy)-4-(1-methylethenyl)benzene}. The weight yield of this product to fed 1-(1-ethoxyethoxy)-4-(1-methylethenyl)benzene was 69.6%. Furthermore, the result of GPC analysis on the basis of polystyrene standard indicate that the obtained polymer had a weight-average molecular weight (Mw) of 21000 and a molecular weight dispersion ratio (Mw/Mn) of 1.02.

EXAMPLE 10

Synthesis of poly{1-(1-ethoxyethoxy)-4-(1-methylethenyl)benizone}

In the same polymerization vessel as in Example 1 were placed 100 ml of benzene as a solvent and 1.7 ml (0.5 mmol) of a 0.3 N tetrahydrofuran solution of α-methylstyrene dimer dipotassium separately prepared as a polymerization initiator and 0.26 g (1.0 mmol) of 1,4,7,10,13,16-hexaoxacyclooctadecane(18-crown-6) as an additive.

This solution was cooled with stirring, and when its internal temperature reached −20° C., 10.0 g (48.5 mmol) of 1-(1-ethoxyethoxy)-4-(1-methylethenyl)benzene synthesized and distilled/purified in the same manner as in Example 1 was then added to the solution. After polymerization was carried out in situ for 2 hours, 5.0 ml of methanol was added thereto to terminate the polymerization. This polymerization solution was poured into 2.0 l of methanol to precipitate the polymer, and this polymer was filtered/separated, and then dried under reduced pressure to obtain 8.69 g of poly{1-(1-ethoxyethoxy)-4-(1-methylethenyl)benzene}. The weight yield of this product to fed 1-(1-ethoxyethoxy)-4-(1-methylethenyl)benzene was 86.9%. Furthermore, the results of GPC analysis on the basis of polystyrene standard indicate that the obtained polymer had a weight-average molecular weight (Mw) of 19000 and a molecular weight dispersion ratio (Mw/Mn) of 1.04.

EXAMPLE 11

Synthesis of poly{1-(1-ethloxyethoxy)-4-(1-methylethenyl)benzene}

In the same polymerization vessel as in Example 1 were placed 50 ml of tetrahydrofuran and 50 ml of hexane as a solvent, 0.5 ml (0.2 mmol) of a 0.4 N tetrahydrofuran solution of sodium naphthalene as a polymerization initiator. This solution was cooled with stirring, and when its internal temperature reached −20° C., 10.0 g (48.5 mmol) of 1-(1-ethoxyethoxy)-4-(1-methylethenyl)benzene synthesized and distilled/purified in the same manner as in Example 1 was then added to the solution. After polymerization was carried out in situ for 3 hours, 5.0 ml of methanol was added thereto to terminate the polymerization. This polymerization solution was poured into 2.0 l of methanol to precipitate the polymer, and this polymer was filtered/separated, and then dried under reduced pressure to obtain 8.24 g of poly{1-(1-ethoxyethoxy)-4-(1-methylethenyl)benzene}. The weight yield of this product to fed 1-(1-ethoxyethoxy)-4-(1-methylethenyl)benzene was 82.4%. Furthermore, the results of GPC analysis on the basis of polystyrene indicate that the obtained polymer had a weight-average molecular weight (Mw) of 24000 and a molecular weight dispersion ratio (Mw/Mn) of 1.08.

EXAMPLE 12

Synthesis of poly{4-(1-methylethenyl)phenol}

An acid treatment was carried out by the same procedure as in Example 1, using poly{1-(1-ethoxyethoxy)-4-(1-methylethenyl)benzene} synthesized by the same procedure as in Example 1, except that a 35% aqueous hydrochloric acid solution was replaced with 1.0 ml of a 0.1 N aqueous sulfuric acid solution, and a temperature was changed to 60° C. Isolation and drying operation were done in the same manner as in Example 1 to obtain 2.9 g of poly{4-(1-methylethenyl)phenol}. A weight-average molecular weight (Mw) was 14000, and a molecular weight dispersion ratio (Mw/Mn) was 1.02.

EXAMPLE 13

Synthesis of 1-(1-tert-butoxyethoxy)-4-(1-methylethenyl)benzene

Reaction was carried out by the same procedure as in Example 1 except that 7.46 g (14.5 mmol) of tert-butyl vinyl ether was used in place of ethyl vinyl ether, and alkali extraction and drying were done in the same manner as in Example 1 to obtain an alkali-treated solution. A component analysis was made by a high-speed liquid chromatography, and as a result, it was apparent that 15.95 g (68.0 mmol) of desired 1-(1-tert-butoxyethoxy)-4-(1-methylethenyl) benzene and 0.35 g (2.61 mmol) of 4-(1-methylethenyl) phenol which was the starting material were contained in the solution. Hence, the conversion of 4-(1-methylethenyl) phenol was 96.5%, and the yield of 1-(1-ethoxyethoxy)-4-(1-methylethenyl)benzene to fed 4-(1-methylethenyl)phenol was 91.3%.

After methylene chloride was distilled off from this alkali-treated solution, distillation was carried out under reduced pressure in the presence of sodium hydride to obtain 11.8 g of 1-(1-tert-butoxyethoxy)-4-(1-methylethenyl) benzene.

Synthesis of poly{1-(1-tert-butoxyethoxy)-4-(1-methylethenyl)benzene}

In the same polymerization vessel as in Example 1 were placed 80 ml of benzene as a solvent and 4.5 ml (0.9 mmol) of a 0.2 N tetrahydrofuran solution of α-methylstyrene tetramer disodium separately prepared as a polymerization initiator. This solution was heated to 35° C. with stirring by a water bath, and 10.0 g (42.7 mmol) of 1-(1-tert-butoxyethoxy)-4-(1-methylethenyl)benzene was then added to the solution. After polymerization was carried out in situ for 8 hours, 5.0 ml of methanol was added thereto to terminate the polymerization. This polymerization solution was poured into 2.0 l of methanol to precipitate the polymer, and this polymer was filtered/separated, and then dried under reduced pressure to obtain 7.81 g of a white polymer. The yield of this product to fed 1-(1-tert-butoxyethoxy)-4-(1-methylethenyl)benzene was 77.6%. Furthermore, it was confirmed by the results of $^1$H-NMR analysis, IR analysis and elemental analysis that the obtained white polymer was poly{1-(1-tert-butoxyethoxy)-4-(1-methylethenyl)benzene} The results of GPC analysis on the basis of polystyrene standard indicate that the obtained polymer had a weight-average molecular weight (Mw) of 22000 and a molecular weight dispersion ratio (Mw/Mn) of 1.05.

Synthesis of poly{4-(1-methylethenyl)phenol}

In a 100 ml Erlenmeyer flask with a stirrer were placed 5.00 g of synthesized poly{1-(1-tert-butoxyethoxy)-4-(1-methylethenyl)benzene} and 30 ml of acetone as a solvent. Next, 0.1 ml of a 35%, aqueous hydrochloric acid solution was added thereto, followed by stirring at room temperature for 3 hours to carry out acid treatment.

This solution subjected to the acid treatment was poured into 500 ml of water to precipitate the resultant polymer, and this polymer was filtered/separated and then dried under reduced pressure to obtain 2.6 g of poly{4-(1-methylethenyl)phenol}. The results of GPC analysis on the basis of polystyrene standard indicate that the obtained polymer had a weight-average molecular weight (Mw) of 17000 and a molecular weight dispersion ratio (Mw/Mn) of 1.05.

EXAMPLE 14

Synthesis of poly{1-(1-tert-butoxyethoxy)-4-(1-methylethenyl)benzene}

In the same polymerization vessel as in Example 1 were placed 80 ml of benzene as a solvent and 2.3 ml (0.7 mmol) of a 0.3 N tetrahydrofuran solution of anthracene potassium separately prepared as a polymerization initiator. This solution was heated to 35° C. with stirring on a water bath, and 10.0 g (42.7 mmol) of 1-(1-tert-butoxyethoxy)-4-(1-methylethenyl)benzene synthesized and distilled/purified in the same manner as in Example 13 was then added to the solution. After polymerization was carried out in situ for 8 hours, 5.0 ml of methanol was added thereto to terminate the polymerization.

This polymerization solution was poured into 2.0 l of methanol to precipitate the polymer, and this polymer was filtered/separated, and then dried under reduced pressure to obtain 7.52 g of poly{1-(1-tert-butoxyethoxy)-4-(1-methylethenyl)benzene}. The weight yield of this product to fed 1-(1-tert-butoxyethoxy)-4-(1-methylethenyl)benzene was 75.2%. The results of GPC analysis on the basis of polystyrene standard indicate that the obtained polymer had a weight-average molecular weight (Mw) of 21000 and a molecular weight dispersion ratio (Mw/Mn) of 1.07.

EXAMPLE 15

Synthesis of 1-(2-tetrahydrofuranyloxy)-4-(1-methylethenyl)benzene

In the same reactor as in Example 1 were placed 10.0 g (74.6 mmol) of 4-(1-methylethenyl)phenol, 5.0 ml (5.0 mmol) of a 1 N diethyl ether solution of hydrogen chloride as an acid and 100.0 ml of diethyl ether as a solvent. This solution was ice-cooled with stirring, and when its internal temperature reached 0° C., 15.77 g (225.0 mmol) of 2,3-dihydrofuran was added dropwise thereto through a dropping funnel. After the dropping over 20 minutes, reaction was carried out in situ for 8 hours under an air atmosphere.

After the completion of the reaction, this reaction solution was transferred to a 300 ml of separatory funnel, and then extracted and washed 3 times with 100 ml of a 0.2 N aqueous sodium hydroxide solution and further washed twice with 100 ml of ion exchanged water to remove the acid component. The alkali liquor used for the extraction was mixed with water and reverse extraction was then carried out with diethyl ether which was a reaction solvent, and the resultant extract was then mixed with a first organic layer. The thus obtained organic solution was dried over anhydrous sodium sulfate, and component analysis was made by a high-speed liquid chromatography. As a result, it was apparent that 9.39 g (46.0 mmol) of desired 1-(2-tetrahydrofuranyloxy)-4-(1-methylethenyl)benzene and 2.97 g (22.1 mmol) of 4-(1-methylethenyl)phenol which was the starting material were contained in the solution. Hence, the conversion of 4-(1-methylethenyl)phenol was 70.3%, and the yield of 1-(2-tetrahydrofuranyloxy)-4-(1-methylethenyl)benzene to fed 4-(1-methylethenyl)phenol was 61.7%.

After diethyl ether was distilled off from the obtained organic solution subjected to the alkali treatment, produced 1-(2-tetrahydrofuranyloxy)-4-(1-methylethenyl)benzene was distilled at 80° C. under 2.0 mmHg in the presence of calcium hydride to purify it. The weight of obtained polymer was 7.6 g. In addition, produced 1-(2-tetrahydrofuranyloxy)-4-(1-methylethenyl)benzene was identified by $^1$H-NMR, $^{13}$C-NMR, IR and elemental analysis.

Synthesis of poly{1-(2-tetrahydrofuranyloxy)-4-(1-methylethenyl)benzene}

A stirrer was put in a 100 ml Schlenk type flask under an argon atmosphere, and 50 ml of tetrahydrofuran as a solvent and 0.3 ml (0.3 mmol) of a 1.08 N cyclohexane solution of sec-butyl lithium as a polymerization initiator were then fed to the flask. After this solution was cooled to −78° C. with stirring by a dry ice-methanol bath, 5.0 (24.5 mmol) of distilled/purified 1-(2-tetrahydrofuranyloxy)-4-(1-methylethenyl)benzene was added thereto. After polymerization was carried out in situ for 5 hours, 5.0 ml of methanol was added to terminate the polymerization. This polymerization solution was poured into 1.0 L of methanol to precipitate the resultant polymer, and this polymer was filtered/separated and then dried under reduced pressure to obtain 4.61 g of the white polymer. The weight yield of the polymer to fed 1-(2-tetrahydrofuranyloxy)-4-(1-methylethenyl)benzene was 92.2%. It was confirmed by the results of $^1$H-NMR analysis, IR analysis and elemental analysis that the obtained white polymer was poly{1-(2-tetrahydrofuranyloxy)-4-(1-methylethenyl)benzene} desired. The results of GPC analysis on the basis of polystyrene standard indicate that the obtained polymer had a weight-average molecular weight (Mw) of 16000 and a molecular weight dispersion ratio (Mw/Mn) of 1.06.

Synthesis of poly{4-(1-methylethenyl)phenol}

In a 100 ml Erlenmeyer flask with a stirrer were placed 5.00 g of synthesized poly{1-(2-tetrahydrofuranyloxy)-4-(1-methylethenyl)benzene} and 30 ml of methanol as a solvent. 0.1 ml of a 35% aqueous hydrochloric acid solution was added to the solution, followed by stirring at room temperature for 3 hours to carry out acid treatment.

This solution subjected to the acid treatment was poured into 500 ml of water to precipitate the resultant polymer, and this polymer was filtered/separated and then dried under reduced pressure to obtain 2.8 g of poly{4-(1-methylethenyl)phenol}. In addition, the results of GPC analysis on the basis of polystyrene standard indicate that the obtained polymer had a weight-average molecular weight (Mw) of 13000 and a molecular weight dispersion ratio (Mw/Mn) of 1.06.

EXAMPLE 16

Synthesis of poly{1-(2-tetrahydrofuranyloxy)-4-(1-methylethenyl)benzene}

A stirrer was put in a 200 ml Schlenk type flask under an argon atmosphere, and 40 ml of tetrahydrofuran and 40 ml of hexane as solvents and 2.3 ml (0.9 mmol) of a 0.4 N cyclohexane solution of sodium naphthalene as a polymerization initiator were then fed to the flask. After this solution was cooled to −20° C. with stirring, 20.0 g (97.9 mmol) of 1-(2-tetrahydrofuranyloxy)-4-(1-methylethenyl)benzene synthesized and distilled/purified in the same manner as in Example 15 was added thereto. After polymerization was carried out in situ for 3 hours, 5.0 ml of methanol was added to terminate the polymerization. This polymerization solution was poured into 2.0 ml of methanol to precipitate the resultant polymer, and this polymer was filtered/separated and then dried under reduced pressure to obtain 17.26 g of poly{(1-(2-tetrahydrofuranyloxy)-4-(1-methylethenyl) benzene}. The weight yield of the polymer to fed 1-(2-tetrahydrofuranyloxy)-4-(1-methylethenyl)benzene was 86.3%. In addition, the results of GPC analysis on the basis of polystyrene standard indicate that the obtained polymer had a weight-average molecular weight (Mw) of 19000 and a molecular weight dispersion ratio (Mw/Mn) of 1.08.

EXAMPLE 17

Synthesis of poly{1-(1-ethoxyethoxy)-4-(1-methylethenyl)benzene}

Reaction was carried out for 1 hour by the same procedure as in Example 1 except that tetrahydrofuran was used as a solvent in place of methylene chloride and all the operations were done under a nitrogen atmosphere. After the completion of the reaction, 10.0 g of ICN Alumina N-Active 1 (made by ICN Biomedical Co., Ltd.) was added to the reaction solution, and this reaction solution was then filtered under reduced pressure through a glass filter having an inner diameter of 4.7 cm on which this active alumina was spread. Afterward, it was washed twice with 10 ml of tetrahydrofuran, and the resultant filtrates were joined, thereby obtaining about 120 ml of an active alumina-treated solution. Reaction results were calculated in the same manner as in Example 1, and as a result, the conversion of 4-(1-methylethenyl)phenol was 99.4%, and the yield of 1-(1-ethoxyethoxy)-4-(1-methylethenyl)benzene to fed 4-(1-methylethenyl)phenol was 97.8%.

100 ml of this alumina-treated solution was directly transferred to a 200 ml Schlenk type flask, and a stirrer was then put in the flask. After sufficient purging with argon, the solution was cooled to −78° C. with stirring by a dry ice-methanol bath, and 0.5 ml (0.2 mmol) of a 0.4 N tetrahydrofuran solution of sodium naphthalene was added as a polymerization initiator. Next, polymerization was carried out in situ for 6 hours, and 5.0 ml of methanol was then added to the reaction system to terminate the polymerization. This polymerization solution was poured into 2.0 ml of methanol to precipitate the resultant polymer, and this polymer was filtered/separated and then dried under reduced pressure to obtain 6.13 g of poly{1-(1-ethoxyethoxy)-4-(1-methylethenyl)benzene}. The weight yield of isolated poly{1-(1-ethoxyethoxy)-4-(1-methylethenyl)benzene} to 4-(1-methylethenyl)phenol which was the starting material was 61.3% on condition that any loss during the process was not taken into consideration. In addition, the results of GPC analysis on the basis of polystyrene standard indicate that the obtained polymer had a weight-average molecular weight (Mw) of 16000 and a molecular weight dispersion ratio (Mw/Mn) of 1.08.

What is claimed is:

1. A poly{1-(1-alkoxyalkoxy)-4-(1-methylethenyl) benzene} having a narrow molecular weight distribution, which is a weight-average molecular weight of 2,000 to 100,000, and a weight-average molecular weight/number-average molecular weight ratio (Mw/Mn) of 1.6 or less, and having a repeating unit represented by the chemical formula (1)

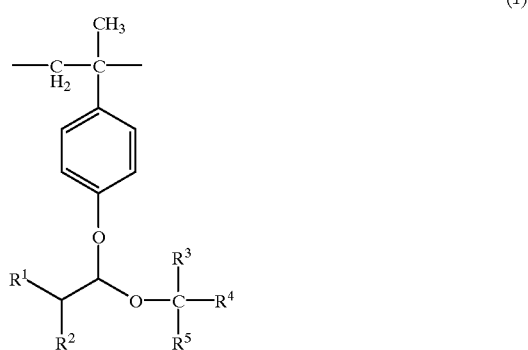

(1)

wherein $R_1$ is hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure, which is produced by anionic polymerization in the presence of organic alkali metal compound as a polymerization initiator.

2. The poly{1-(1-alkoxyalkoxy)-4(1-methylethenyl) benzene} having a narrow molecular weight distribution according to claim 1 wherein the repeating unit is represented by the chemical formula (2)

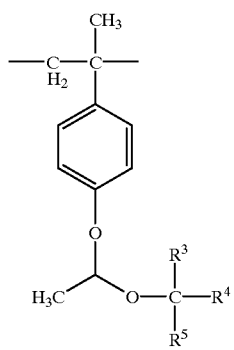

(2)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

3. The poly{1-(1-alkoxyalkoxy)-4-(1-methylethenyl) benzene} having a narrow molecular weight distribution according to claim 1 wherein the repeating unit is represented by the chemical formula (3):

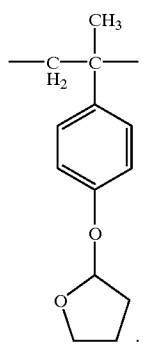

(3)

4. A preparation process of a poly{1-(1-alkoxyalkoxy)-4-(1-methylethenyl)benzene} having a narrow molecular weight distribution described in claim 1 which comprises the steps of reacting 4-(1-methylethenyl)phenol with a vinyl ether represented by the chemical formula (4)

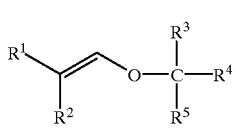

(4)

wherein $R^1$ is hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure, in the presence of an acid to prepare a 1-(1-alkoxyalkoxy)-4-(1-methylethenyl)benzene represented by the chemical formula (5)

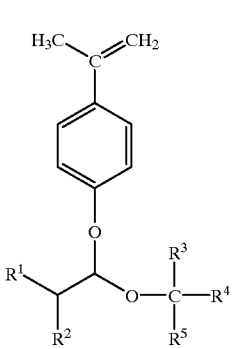

(5)

wherein $R^1$ is hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure, and then subjecting this compound to an anionic polymerization in the presence of an organic alkali metal compound as a polymerization initiator.

5. The process according to claim 4 wherein the vinyl ether represented by the chemical formula (4) is a compound represented by the chemical formula (6)

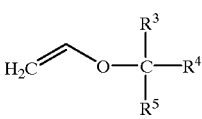

(6)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms, and the 1-(1-alkoxyalkoxy)-4-(1-methylethenyl)benzene represented by the chemical formula (5) is a compound represented by the chemical formula (7)

(7)

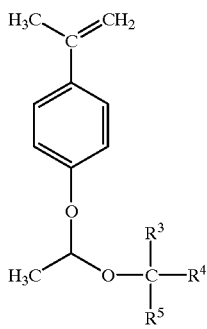

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

6. The prosess according to claim 4 wherein the vinyl ether represented by the chemical formula (4) is a dihydrofuran, and the 1-(1-alkoxyalkoxy)-4-(1methylethenyl)benzene represented by the chemical formula (5) is (8)

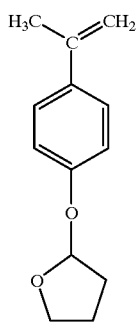

a compound represented by the chemical formula (8).

7. A preparation process of poly{4-(1-methylethenyl) phenol} having a narrow molecular weight distribution according to claim 4 which comprises the steps of reacting 4-(1-methylethenyl)phenol with a vinyl ether represented by the chemical formula (4) in the presence of an acid to form a 1-(1-alkoxyalkoxy)-4-(1-methylethenyl)benzene represented by the chemical formula (5), subjecting this compound to an anionic polymerization in the presence of an organic alkali metal compound as a polymerization initiator to form a poly{1-(1-alkoxyalkoxy)-4-(1-methylethenyl) benzene} having said narrow molecular weight distribution, and then bringing this compound into contact with a protonic acid in the presence of an organic solvent to carry out an alkoxyalkoxy group eliminating reaction.

8. The process according to claim 7 wherein the vinyl ether represented by the chemical formula (4) is a compound represented by the chemical formula (6), and the 1-(1-alkoxyalkoxy)-4-(1-methylethenyl)benzene represented by the chemical formula (5) is a compound represented by the chemical formula (7), wherein chemical formulas (6) and (7) are as follows:

(6)

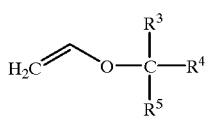

wherein $R^3$, $R^4$ and $R^5$ are each hydrogen, and alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms, (7)

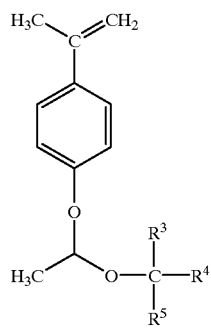

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

9. The process according to claim 7 wherein the vinyl ether represented by the chemical formula (4) is a dihydrofuran, and the 1-(1-alkoxyalkoxy)-4-(1-methylethenyl)benzene represented by the chemical formula (5) is a compound represented by the chemical formula (8)

(8)

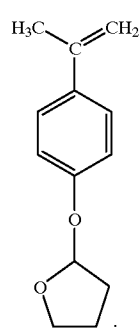

10. The process according to claim 4 wherein the organic alkali metal compound is a compound represented by (9)

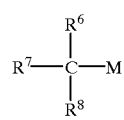

the chemical formula (9)

wherein $R^6$ and $R^7$ are each independently an alkyl group having 1 to 10 carbon atoms, an un-substituted or alkyl-substituted aryl group having 6 to 12 carbon atoms; $R^6$ is hydrogen or an alkyl group having 1 to 10 carbon atoms; and M is an alkali metal selected from the group consisting of lithium, sodium, potassium and cesium, a compound represented by the chemical formula (10)

(10)

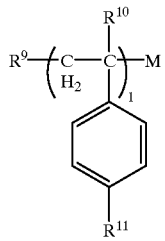

wherein $R^9$ is hydrogen or an alkyl group having 1 to 10 carbon atoms; $R^{10}$ is an alkyl group having 1 to 3 carbon atoms, or an un-substituted or alkyl-substituted aryl group having 6 to 12 carbon atoms; $R^{11}$ is hydrogen or an alkyl group, an alkoxy group or an alkoxyalkoxy group having 1 to 10 carbon atoms; M is an alkali metal selected from the group consisting of lithium, sodium, potassium and cesium; and l is an integer of 1 to 200, a compound represented by the chemical formula (11)

(11)

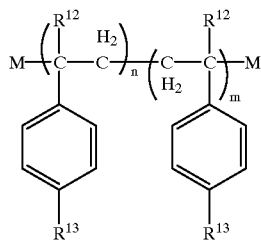

wherein $R^{12}$ is an alkyl group having 1 to 3 carbon atoms; $R^{13}$ is hydrogen or an alkyl group, an alkoxy group or an alkoxyalkoxy group having 1 to 10 carbon atoms; M is an alkali metal selected from the group consisting of lithium, sodium, potassium and cesium; m and n are each an integer of 1 to 100, or a compound represented by the chemical formula (12)

M—Ar  (12)

wherein Ar is an organic group selected from the group consisting of naphthalene, anthracene, indene, cyclopentadiene and fluorene; and M is an alkali metal selected from the group consisting of lithium, sodium, potassium and cesium.

11. The process according to claim 7 wherein the organic alkali metal compound is a compound represented by the chemical formula (9), the chemical formula (10), the chemical formula (11) or the chemical formula (12) as follows:

(9)

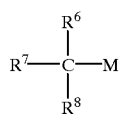

wherein $R^6$ and $R^7$ are each independently an alkyl group having 1 to 10 carbon atoms, an un-substituted or alkyl-substituted aryl group having 6 to 12 carbon atoms; $R^8$ is hydrogen or an alkyl group having 1 to 10 carbon atoms; and M is an alkali metal selected from the group consisting of lithium, sodium, potassium and cesium, (10)

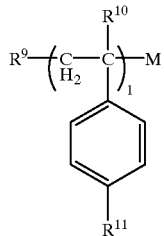

wherein $R^9$ is hydrogen or an alkyl group having 1 to 10 carbon atoms; $R^{10}$ is an alkyl group having 1 to 3 carbon atoms, or an un-substituted or alkyl-substituted aryl group having 6 to 12 carbon atoms; $R^{11}$ is hydrogen or an alkyl group, an alkoxy group or an alkoxyalkoxy group having 1 to 10 carbon atoms; M is an alkali metal selected from the group consisting of lithium, sodium, potassium and cesium; and l is an integer of 1 to 200, (11)

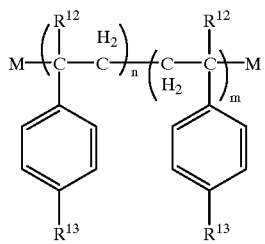

wherein $R^{12}$ is an alkyl group having 1 to 3 carbon atoms; $R^{13}$ is hydrogen or an alkyl group, an alkoxy group or an alkoxyalkoxy group having 1 to 10 carbon atoms; M is an alkali metal selected from the group consisting of lithium, sodium, potassium and cesium; m and n are each an integer of 1 to 100,

M—A  (12)

wherein Ar is an organic group selected from the group consisting of naphthalene, anthracene, indene, cyclopentadiene and fluorene; and M is an alkali metal selected from the group consisting of lithium, sodium, potassium and cesium.

12. The process according to claim 4 wherein the organic alkali metal compound is selected from the group consisting of sec-butyl lithium, α-methylstyrene dimer dipotassium, α-methylstyrene tetramer disodium, cumyl potassium, cumyl cesium, sodium naphthalene and anthracene sodium.

13. The process according to claim 7 wherein the organic alkali metal compound is selected from the group consisting of sec-butyl lithium, α-methylstyrene dimer dipotassium, α-methylstyrene tetramer disodium, cumyl potassium, cumyl cesium, sodium naphthalene and anthracene sodium.

14. The process according to claim 5 wherein the compound represented by the chemical formula (6) is selected from the group consisting of methyl vinyl ether, ethyl vinyl ether, n-propyl vinyl ether, iso-propyl vinyl ether, n-butyl vinyl ether, sec-butyl vinyl ether, tert-butyl vinyl ether and tert-amyl vinyl ether.

15. The process according to claim 8 wherein the compound represented by the chemical formula (6) is selected from the group consisting of methyl vinyl ether, ethyl vinyl ether, n-propyl vinyl ether, iso-propyl vinyl ether, n-butyl vinyl ether, sec-butyl vinyl ether, tert-butyl vinyl ether and tert-amyl vinyl ether.

16. The process according to claim 6 wherein the dihydrofuran is 2,3-dihydrofuran.

17. The process according to claim 9 wherein the dihydrofuran is 2,3-dihydrofuran.

18. A resist material which comprises a polymer having a weight-average molecular weight of 2,000 to 100,000, a weight-average molecular weight/number-average molecular weight ratio of 1.6 or less and a repeating unit represented by the chemical formula (1)

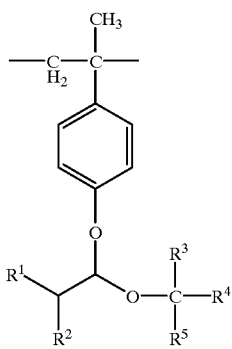

(1)

wherein $R^1$ is a hydrogen or an alkyl group having 1 to 3 carbon atoms; $R^2$ is hydrogen, an alkyl group having 1 to 6 carbon atoms or an alkoxy group having 1 to 6 carbon atoms; $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms, or an alkoxyalkoxy group having 1 to 10 carbon atoms; and $R^2$ and $R^3$ may bond to each other to form a ring structure.

19. A resist material which comprises a polymer described in claim 18 wherein the repeating unit is represented by the chemical formula (2)

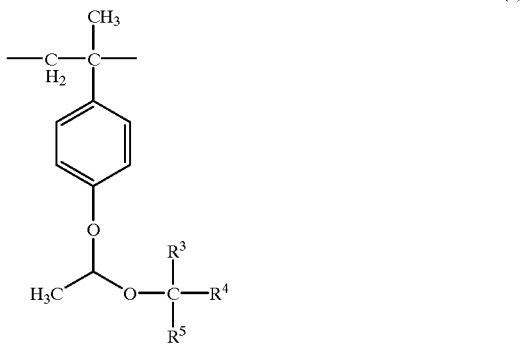

(2)

wherein $R^3$, $R^4$ and $R^5$ are each hydrogen, an alkyl group having 1 to 10 carbon atoms, an un-substituted, alkyl-substituted or alkoxy-substituted aryl group having 6 to 12 carbon atoms, an alkoxy group having 1 to 10 carbon atoms or an alkoxyalkoxy group having 1 to 10 carbon atoms.

20. A resist material which comprises a polymer described in claim 18 wherein the repeating unit is represented by the chemical formula (3)

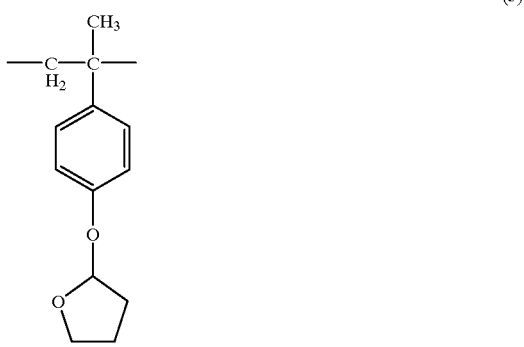

(3)

* * * * *